(12) United States Patent
Furutani et al.

(10) Patent No.: US 6,411,654 B1
(45) Date of Patent: Jun. 25, 2002

(54) CONVOLUTIONAL INTERLEAVER, CONVOLUTIONAL DEINTERLEAVER, CONVOLUTIONAL INTERLEAVING METHOD, AND CONVOLUTIONAL DEINTERLEAVING METHOD

(75) Inventors: Senichi Furutani, Daito; Yasuhiro Nakakura, Toyonaka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/300,384

(22) Filed: Apr. 27, 1999

(30) Foreign Application Priority Data

Apr. 27, 1998 (JP) .......................................... 10-117342

(51) Int. Cl.⁷ ............................................. H04L 23/02
(52) U.S. Cl. ........................................ 375/262; 375/265
(58) Field of Search ................................. 375/259, 262, 375/265, 341; 714/701, 702, 728, 786, 792, 794, 795

(56) References Cited

U.S. PATENT DOCUMENTS

| | | |
|---|---|---|
| 3,652,998 A | 3/1972 | Forney, Jr. |
| 5,042,033 A | 8/1991 | Costa |
| 5,210,450 A | 5/1993 | Parkinson |
| 5,537,420 A | 7/1996 | Huang |
| 5,572,532 A | 11/1996 | Fimoff et al. |
| 5,764,649 A | 6/1998 | Tong |
| 6,035,427 A | * 3/2000 | Kweon ........................ 714/702 |
| 6,304,609 B1 | * 10/2001 | Stephens et al. ............. 375/259 |

FOREIGN PATENT DOCUMENTS

| | | |
|---|---|---|
| EP | 0 026 050 | 4/1981 |
| EP | 0 681 373 | 11/1995 |
| GB | 2 315 002 | 1/1998 |
| JP | 9-102748 | 4/1997 |

* cited by examiner

Primary Examiner—Don N. Vo
(74) Attorney, Agent, or Firm—Wenderoth, Lind & Ponack, L.L.P.

(57) ABSTRACT

A convolutional interleaver performs convolutional inerleaving for a data group in which the input/output data width is b bits, the depth, i.e., the number of data in bit width units, is m, the number of channels is n, and the maximum channel number is C (n=integer satisfying the relation $0 \leq n \leq C$, b,m,C=natural number). This interleaver includes a delay unit comprising first and second delay units and performing a delay of $n\tau$ for data of the n-th channel (T=a predetermined amount of delay, T>0) The first delay unit performs a delay of is (S=a predetermined amount of delay, $0<S \leq T$) for the i-th group amongst groups into which all the channels are grouped such that each group comprises at most k channels, and the second delay unit performs a delay equivalent to a deficiency in the delay of the first delay unit for the delay of nT to be given to the data of the n-th channel. Therefore, delays to be commonly generated between channels in each group are generated together by the first delay unit, and delays including differences in delays between the channels are individually generated by the second delay unit, whereby control and structure of the delay means can be simplified.

26 Claims, 19 Drawing Sheets

CONVOLUTIONAL INTERLEAVER, CONVOLUTIONAL DEINTERLEAVER, CONVOLUTIONAL INTERLEAVING METHOD, AND CONVOLUTIONAL DEINTERLEAVING METHOD

FIELD OF THE INVENTION

The present invention relates to a convolutional interleaver, a convolutional deinterleaver, a convolutional interleaving method, and a convolutional deinterleaving method, which are required for digital transmission of satellite broadcasting, ground wave broadcasting, CATV broadcasting, etc, and for reading/writing of a storage unit such as a hard disk.

BACKGROUND OF THE INVENTION

A convolutional deinterleaving method is effective as a countermeasure against burst errors.

Burst errors will be briefly described taking satellite broadcasting as an example. A broadcast wave from a broadcasting station on earth is transmitted to a satellite and relayed at the satellite to a satellite broadcast receiver provided in home.

The wave transmitted from the broadcasting station through the satellite to home is subjected to interference by thunder, rain or the like in the transmission path and while the wave is subjected to such interference, errors occur in data. These errors are called "burst errors".

In digital transmission, information for error correction is added to the original data in advance and, therefore, it is possible to correct errors so long as the errors are within a predetermined range of bits in each segment. However, since burst errors occur continuously over the range, it is impossible to correct burst errors.

So, as a countermeasure against burst errors, data to be transmitted are temporally dispersed in advance. To be specific, by temporally dispersing the data at the transmitting end, even when burst errors occur in the process of transmission, the burst errors are dispersed when recovering the temporal, positions of the dispersed data at the receiving end, whereby the burst errors can be limited within a correctable range of bit number in each data unit.

In this way, a method of temporally dispersing data to be transmitted is "convolutional interleaving", and a method of restoring the temporal positions of the dispersed data at the receiving end is "convolutional deinterleaving".

There has been proposed a convolutional interleaver used for the above-mentioned purpose by, for example, Japanese Published Patent Application No. Hei. 7-170201.

FIG. 13 is a block diagram illustrating a convolutional interleaver disclosed in the above-mentioned prior art. With reference to FIG. 1–3, input data which is serially input to the interleaver through an input terminal 1000 is read into a serial-parallel conversion shift register 3000 according to a high-speed clock input through a clock input terminal 2000, wherein the serial data is converted to N stages of parallel signals.

Then, the serial-to-parallel conversion shift register 3000 outputs the N stages of parallel signals together with the clock signal which has been subjected to 1/N frequency division by an N-stage frequency divider 4000. The N stages of parallel signals are respectively input to shift registers 5001, 5002, 5003, . . . , 500 (N−1) which give delays to input data thereof, wherein those parallel signals are given delay times in proportion to the stage numbers of the respective shift registers, M, 2M, 3M, . . . , (N−1) M. Then, the N stages of parallel signals which have been delayed by the shift registers 5001, 5002, 5003, . . . , 500 (N−1) are input to a parallel-to-serial conversion shift register 6006 to be converted to a serial signal. The serial signal is output from an output terminal 7000 as data obtained by interleaving the data at the input terminal 1000.

FIG. 14 is a block diagram illustrating a convolutional deinterleaver for deinterleaving the data interleaved by the convolutional interleaver shown in FIG. 13. With reference to FIG. 14, input data applied to an input terminal 11000 is read into a serial-to-parallel conversion shift resister 13000 according to a high-speed clock input through a clock input terminal 12000, wherein the input data is converted to N stages of parallel signal.

Then, the serial-to-parallel conversion shift register 11,000 outputs the N stages of parallel signals together with the clock signal which has been subjected to 1/N frequency division by an N-stage frequency divider 14000. The N stages of parallel signals are respectively input to shift registers 900 (N−1), . . . , 9003, 9002, 9001 which give delays to input data, wherein these parallel signals are given delay times in proportion to the stage numbers of the respective shift registers, (N−1) M, . . . , 3M, 2M, M. Then, the N stages of parallel signals respectively delayed by the shift registers 900 (N−1), . . . , 9003, 9002, 9001 are input to a parallel-to-serial conversion shift register 16000 to be converted to a serial signal. The serial signal is output from an output terminal 17000 as data obtained by deinterleaving the data at the input terminal 11000.

As described above, the convolutional interleaver shown in FIG. 13 or the convolutional deinterleaver shown in FIG. 14 requires multiple stages of shift registers, resulting in an increase in the circuit scale.

Meanwhile, as a prior art which can solve the above-described problem, a convolutional interleaver using a RAM has been proposed.

The structure of the convolutional interleaver is shown in FIG. 15. With reference to FIG. 15, the convolutional interleaver comprises a single port RAM 13, an input data control means 9, a select signal generating means 10, a RAM control means 11, an address generating means 3, a writing means 12, a reading means 14, and an output signal selector 15. The single port RAM 13 outputs data to the reacting means 14. The input data control means 9 outputs input of the convolutional interleaver to the input data writing means 12 and the output signal selector 15. The select signal generating means 10 outputs a control signal to the lower address selector 7 and the RAM control means 11. The RAM control means 11 outputs a control signal to the RAM 13 and the output signal selector 15. The address generating means 3 outputs an address to the writing means 12 and the reading means 14. The writing means 12 outputs an address and data to the RAM 13. The reading means 14 outputs an address and data to the RAM 13. The output signal selector 15 generates an output signal of the convolutional interleaver.

The address generating means 3 comprises an upper address generating means 4, a lower address generating means 5, and an output timing adjusting means 8. The upper address generating means 4 outputs an upper address for each channel to the output timing adjusting means 8 and the reading means 14. The lower address generating means 5 outputs a lower address for each channel to the output timing adjusting means 8 and the reading means 14.

The lower address generating means 5 comprises a counter unit 6 and a lower address selector 7. The counter unit 6 outputs a lower address For each channel to the lower address selector 7. The counter unit 6 comprises counters 60~6C corresponding to channels ch0~chC, respectively. The lower address selector 7 outputs a lower address to the output timing adjusting means 8.

Both of the select signal generating means 10 and the address generating means 3 shown in FIG. 15 serve as an input side selector in the operation principle which is later described using FIG. 16. On the other hand, both of the output signal selector 15 and the address generating means 3 serve as an output side selector in the operation principle.

Hereinafter, the operation principle of the convolutional interleaver shown in FIG. 15 will be described with reference to FIG. 16.

In FIG. 16, reference numeral 102 denotes a single port RAM which synchronizes with a clock of frequency of f, and numerals 100 and 101 denote selectors disposed at the input side and the output side of the single port RAM 102, respectively. The single port RAM 102 has multiple stages of storage areas corresponding to the respective channels and each having a bit width b, and the number of the storage areas is equal to "depth (m)×number of channels (N)" wherein m is the number of data in bit width units, and $0 \leq N \leq C$. The selectors 100 and 101 select the channels circularly and synchronously with each other. To be specific, these selectors 100 and 101 start from ch0, successively increment the channel number, and return to ch0, when reaching chC to repeat the same operation as above.

Initially, both the selectors 100 and 101 select channel ch0. Since no delay element exists at this channel, the signal of ch0, travels through the convolutional interleaver without being delayed.

Next, the selectors 100 and 101 select ch1. Since an FIFO is implemented by RAM (storage area) 102-0 at this channel, a signal delayed by this RAM 102-0 is output.

Thereafter, in similar manner, the selectors 100 and 101 successively select ch2, ch3, . . . , chN–1, whereby signals which are delayed by 2, 3, . . . , N–1(>1) times as much as the delay at ch1 by RAM 102-1, RAM 102-2, . . . , RAM 102-(N–2), are output, respectively.

Then, the selectors 100 and 101 select chN. At this channel, a signal delayed by N(>1) times as much as the delay at ch1 by RAM 102-(N–1) is output.

Then, the selectors 100 and 101 select chC. At this channel, a signal delayed by C(>N) times as much as the, delay at ch1 by RAM 102-(C–1) is output.

At the next point of time, the selectors 100 and 101 select ch0 again to repeat the above-mentioned operation.

As described above, the convolutional interleaver reads the oldest data from the storage area of the RAM corresponding to the selected channel, writes the input data of the convolutional interleaver into the address from which the data has been read, and outputs the read data as the output of the convolutional interleaver.

By repeating the above-mentioned processing, the convolutional interleaver performs convolutional interleaving for the input data.

Hereinafter, a description is given of the operation of the convolutional interleaver shown in FIG. 15.

The convolutional interleaver captures input data to be interleaved from the input data terminal 1 by using the input data control means 9, and writes the data into the RAM 13 by using the writing means 12. At this time, for the b-bit data of the respective channels ch0~chC, the counters 60~6C of the lower address generating means 5 corresponding to these channels count the lower addresses of the RAM 13, and the lower address selector 7 selects one of these lower addresses. The lower address so selected and the upper address of the RAM 13 output from the upper address generating means 4 are input to the output timing adjusting means 8, wherein their output timings are adjusted, and then these addresses are input to the writing means 12 to give a write address of the RAM 13.

With respect to the data of ch0, the input data control means 9 transmits this data not through the RAM 13 but directly to the output signal selector 15. The RAM control means 11 selects this non-delayed data which has been sent from the input data control means 9, directly to the output signal selector 15, and outputs this data from the output terminal 2 to the outside.

Further, for the data of ch1~chN~chC, storage areas, the sizes of which gradually increase in order of these channels, are set in the RAM 13 by the upper address generating means 4. Addresses inside the respective storage areas are generated by the counter unit 6 of the lower address generating means 5, and these addresses are selected by the lower address selector 7 every time the selector 7 successively selects the corresponding channels. With respect to the channels to which b-bit data are sequentially applied, the following operation is performed on each storage area foe each channel. That is, the data is written in an address in the storage area and, at the next point of time, the data is read from the address to be written in the next address. In this way, gradually increasing delay times are given to the data of channels ch1~chN~chC, respectively.

Next, a description will be given of the structure of a convolutional deinterleaver which deinterleaves the data interleaved by the convolutional interleaver shown in FIG. 15, by using FIG. 17.

With reference to FIG. 17, the convolutional deinterleaver comprises a single port RAM 33, an input data control means 29, a select signal generating means 30, a RAM control means 31, an address generating means 23, a writing means 32, a reading means 34, and an output signal selector 35. The single port RAM 33 outputs data to the reading means 34. The input data control means 29 outputs input data of the convolutional deinterleaver to the input data writing means 32 and the output signal selector 35. The select signal generating means 30 outputs a control signal to the lower address selector 27 and the RAM control means 31. The RAM control means 31 outputs a control signal to the RAM 33 and the, output signal selector 35. The address generating means 23 outputs an address to the writing means 32 and the reading means 34. The writing means 32 outputs an address and data to the RAM 33. The reading means 34 outputs an address and data to the RAM 33. The output signal selector 35 generates an output signal of the convolutional deinterleaver The address generating means 23 comprises an upper address generating means 24, a lower address generating means 25, and an output timing adjusting means 28. The upper address generating means 24 outputs an upper address for each channel to the output timing adjusting means 28 and the reading means 34. The lower address generating means 25 outputs a lower address for each channel to the output timing adjusting means 28 and the reading means 34.

The lower address generating means 25 comprises a counter unit 26 and a lower address selector 27. The counter unit 26 outputs a lower address for each channel to the lower address selector 27. The counter unit 26 comprises count 260~26C corresponding to channels ch0-chC, respectively.

The lower address selector 27 outputs a lower address to the output timing adjusting means 28.

Both of the select signal generating means 30 and the address generating means 23 serve as an input side selector in the operation principle is later described using FIG. 18. On the other hand, both of the output signal selector 35 and the address generating means 23 serve as an output side selector in the operation principle.

Hereinafter, the operation principle of the convolutional deinterleaver will be described with reference to FIG. 18.

In FIG. 18, reference numeral 1112 denotes a port RAM which synchronies with a clock of frequency of and numerals 1110 and 1111 denote selectors disposed at the input side and the output side of the single port RAM 1112, respectively. The single port RAM 1112 has multiple stages of storage areas corresponding to the respective channels and each having a bit width b, and the number of the storage areas is equal to "depth (m)×(maximum channel numbered (C)–channel number(N)-1)"_0 wherein $0 \leq N \leq C$. The selectors 1110 and 1111 select the channels circularly and synchronously with each other. To be specific, these selectors 1110 and 1111 start from ch0, successively increment the channel number, and return to ch0 when reaching chC to repeat the same operation as above.

Initially, both of the selectors 1110 and 1111 select ch0. At this channel, a signal which is delayed by C(>1) times as much as the delay at ch1 of the convolutional interleaver by RAM 1112-0, is output.

Next, the selectors 1110 and 1111 select ch1. At this channel, a signal which is delayed by (C−1) times as much as the delay at ch1 of the convolutional interleaver by RAM 1112-1, is output.

Thereafter, in a similar manner, the selectors 1110 and 1111 select ch2, ch3, . . . , chN−1 and signals which are delayed by (C−2), (C−3), . . . , (C−(N−1))(>1) times as much as the delay at ch1 of the convolutional interleaver by RAM 1112-2, RAM 1112-3, . . . , RAM 1112-(N−1), respectively, are output.

Then, the selectors 1110 and 111 select chN. At this channel, a signal which is delayed by (C−N) times as much as the delay at ch1 of the convolutional interleaver by RAM 1112-N, is output.

Thereafter, the selectors 1110 and 111 select chC. Since no delay element exists at this channel, the signal at chC travels through the convolutional deinterleaver without being delayed.

At the next point of time, both of the selector 1110 and 1111 select ch0 again to repeat the above-mentioned operation.

As described above, the convolutional deinterleaver reads the oldest data from the storage area of the RAM corresponding to the selected channel, writes the input data of the convolutional deinterleaver into the address from which the data has been read, and outputs the read data as the output of the convolutional deinterleaver.

By repeating the above-mentioned processing, the input data is restored into the same data format as that before the convolutional interleaving.

Next, a description is given of the operation of the convolutional deinterleaver.

The convolutional deinterleaver captures input data to be deinterleaved from the input data terminal 21 by using the input data control means 29 and then writes the data into the RAM 33 by using the writing means 32. At this time, for the b-bit data of the respective channels ch0~chN~chC, the counters 260~26N~26C of the lower addresses generating means 25 corresponding to these channels count the lower addresses of the RAM 33, and the lower address selector 27 selects one of these lower addresses. The lower address so selected and the upper address of the RAM 33 output from the upper address generating means 24 are input to the output timing adjusting means 28, wherein their output timings are adjusted, and then these addresses are input to the writing means 32 to give a write address of the RAM 33.

With respect to the data of chC, the input data control means 29 transmits this data not through the RAM 33 but directly to the output signal selector 35. The RAM control means 31 selects this non-delayed data which has been sent from the input data control means 29 directly to the output signal selector 35, and outputs this data from the output terminal 22 to the outside.

Further, for the data of ch1~chN~chC, storage areas, the sizes of which gradually decrease in order of these channels, are set in the RAM 33 by the upper address generating means 24. Addresses inside the respective storage areas are generated by the counter unit 26 of the lower address generating means 25, and these addresses are selected by the lower address selector 27 every time the selector 27 successively selects the corresponding channels. With respect to the channels to which b-bit data are sequentially applied, the following operation is performed on each storage area for each) channel. That is, the data is written in an address in the storage area and, all, the next point of time, the data is read from the address to be written in the next address. In this way, gradually decreasing delay times are given to the data of channels ch0~chN~chC−1, respectively.

Thereby, the channels ch0~chN~chC are given gradually decreasing delay times by the convolutional deinterleaver shown in FIG. 16 while these channels have been given gradually increasing delay times by the convolutional interleaver shown in FIG. 15. Synthetically, the same delay time is given to all the channels, whereby the data array which has been interleaved by the convolutional interleaver shown in FIG. 15 is deinterleaved (restored) by the convolutional deinterleaver shown in FIG. 16.

By the way, when a digital system is constructed as an integrated circuit, it as required that as many circuits as possible are mounted on the same integrated circuit and the same is required of a system including a convolutional interleaver and a conventional deinterleaver. Therefore, in this kind of system, further reductions in area and power consumption are required of the convolutional interleaver and deinterleaver.

SUMMARY OF THE INVENTION

An object of the present invention is to provide a convolutional interleaver, a convolutional deinterleaver, a convolutional interleaving method, and a convolutional deinterleaving method, which ran realize reductions in area and power consumption by optimizing a RAM control system.

Other objects and advantages of the invention will become apparent from the detailed description that follows. The detailed description and specific embodiments described are provided only for illustrates n since various additions and modifications within the scope of the invention will be apparent to these of skill in the art from the detailed description.

According to a first aspect of the present invention, there is provided a convolutional interleaver performing convolutional interleaving for a data group in which the input/output data width is b bits, the depth, i.e., the number of data-in bit width units, is m, the number of channels is n, and the maximum channel number is C (n=integer satisfying the relation $0 \leq n \leq C$, b,m,C=natural numbers), and this interleaver includes delay means comprising first and second delay units and performing a delay of nT for data of the n-th channel (T=a predetermined amount of delay, T>0). The first delay unit performs a delay of iS (S=a predetermined amount of delay, $0<S \leq T$) for the i-th group amongst groups into which all the channels are grouped such that each group comprises at most k channels, the i-th group comprising channels from the ik-Uh channel to the ((i−1)k−1)-th channel (k=natural number not larger than C, i=integer satisfying the relation $0 \leq i \leq$ (integer part of (C/k)), $(i+1)k-1 \leq C$). The second delay unit performs a delay equivalent to a deficiency in the delay of the first delay unit for the delay of nT to be given to the data of the n-th channel. Therefore, delays to be commonly generated between channels in each group are generated together by the first delay unit, and delays including differences in delays between the channels are individually generated by the second delay unit, whereby control and structure of the delay means can be simplified.

According to a accord aspect of the present invention, in the convolutional interleaver of the first aspect, C is an odd number, k is 2, S and T satisfy the relation S=T, and the second delay unit performs a delay of T for the (2h+1)-th channel (h=integer satisfying the relation $0 \leq 2h+1 \leq C$) and does not perform a delay for the 2h-th channel. Therefore, delays to be commonly generated between two channels in each group are generated together by the first delay unit, and a difference in delays between the two channels is generated for only one of these two channels by the second delay unit, whereby control and structure of the delay means can be simplified.

According to a third aspect of the present invention, there is provided a convolutional interleaver performing convolutional interleaving for a data group in which the input/output data width is b bits, the depth i.e., the number of data in bit width units, is m, the number of channels is n, and the maximum channel number is C (n=integer satisfying the relation $0 \leq n \leq C$, b,m,C=natural numbers), and the interleaver comprises: first storage means having a data width of j×b bits (j=natural number not less than 2); input data control means for distributing input data of the convolutional interleaver to bit connecting means, or second storage means, or output data control means; the second storage means for delaying input data from the input data control means; the bit connecting means for connecting input data from the input data control means and input data from the second storage means to generate data to be input to the first storage means having a data width of j×b bits; address generating means for generating addresses of the first storage means; bit separating means for converting output data from the first storage means into data having a data width of b bits and to be output from the convolutional interleaver; and the output data control means for outputting output data from the bit separating means to the outside of the convolutional interleaver. Therefore, the RAM address generating means is optimized, whereby the area of the address generating circuit is minimized and the frequency of access to the RAM is reduced. Thereby, convolutional interleaving can be performed with the minimum power consumption and, moreover, it can be performed even with a RAM operating at a low frequency.

According to a fourth aspect of the present invention, the convolutional interleaver of the third aspect comprises: the address generating means performing address generation such that the first storage means performs a delay of iS (S=a predetermined amount of delay, 0<S) for the i-th group amongst groups into which all the channels are grouped such that each group comprises at most k channels, the i-th group comprising channels from the ik-th channel to the ((i+1)k−1)-th channel (k=natural number not larger than C, i=integer satisfying the relation $0 \leq i \leq$ (integer part of (C/k)), $(i+1)k-1 \leq C$); the second storage means having a capacity sufficient to perform a delay equivalent to a deficiency in the delay of the first storage means for the delay of nT (T=a predetermined amount of delay, $S \leq T$) to be given to the data of the n-th channel; and switching means for successively switching the channels every time data of b bits and depth m is input, such that the channel of data input to the first storage means and the second storage means is identical in channel number to the channel of the data output from the first storage means. Therefore, the same effects as mentioned above are achieved.

According to a fifth aspect of the present invention, in the convolutional interleaver of the fourth aspect, C is an odd number, k is 2, S and T satisfy the relation S=T, and the second delay unit performs a delay of T for the (2h+1)-th channel (h=integer satisfying the relation $0 \leq 2h+1 \leq C$) and does not perform a delay for the 2h-th channel. Therefore, the same effects as mentioned above are achieved.

According to a sixth aspect of the present invention, in the convolutional interleaver of the third aspect, the second storage means and the first storage means are constructed by the same kind of storage means. Therefore, the same effects as mentioned above are achieved.

According to a seventh aspect of the present invention, in the convolutional interleaver of the third aspect, the first storage means is constructed by a RAM. Therefore, the same effects as mentioned above are achieved.

According to an eighth aspect of the present invention, in the convolutional interleaver of the seventh aspect, the RAM has j pieces of input/output ports (j=natural number not less than 2). Therefore, the same effects as mentioned above are achieved.

According to a ninth aspect of the present invention, there is provided a convolutional deinterleaver performing convolutional deinterleaving for a data group in which the input/output data width, is b bits, the depth, i.e., the number of data in bit width units, is m, the number of channels is n, and the maximum channel number is C (n=integer satisfying the relation $0 \leq n \leq C$, b,m,C=natural numbers), . . . , and the deinterleaver includes delay means comprising first and second delay units and performing a delay of (C−n)T for data of the n-th channel (T=a predetermined amount of delay, T=0). The first delay unit performs a delay of (C−i)S (S—a predetermined amount of delay, $C \leq S \leq T$) for the i-th group amongst groups into which all the channels are grouped such that each group comprises at most k channels, the i-th group comprising channels from the ik-th channel to the (i+1)k−1)-th channel (k=natural number not larger than C, i=integer satisfying the relation $0 \leq i \leq$ (integer part of (C/k)), $(i+1)k-1 \leq C$), and the second delay unit performs a delay equivalent to a deficiency in the delay of the first delay unit for the delay of (C−n)T to be given to the data of the n-th channel. Therefore, delays to be commonly generated between channels in each group are generated together by the first delay unit, and delays including differences in delays between the channels are individually generated by the second delay unit, whereby control and structure of the delay means can be simplified.

According to a tenth aspect of the present invention, in the convolutional deinterleaver of the ninth aspect, C is an odd number, k is 2, S and T satisfy the relation S=T, and the second delay unit performs a delay of T for the (2h+1)-th channel (h=integer satisfying the relation 0≦2h+1≦C) and does not perform a delay for the 2h-th channel. Therefore, delays to be commonly generated between two channels in each group are generated together by the first delay unit, and a difference in delays between the two channels is generated for only one of these two channels by the second delay unit, whereby control and structure of the delay means can be simplified.

According to an eleventh aspect of the present invention, there is provided a convolutional deinterleaver performing convolutional deinterleaving for a data group in which the input/output data width is b bits, the depth, the number of data in bit width units, is m, the number of channels is n, and the maximum channel number is C (n=integer satisfying the relation 0≦n≦C, b,m,C=natural numbers), and the deinterleaver comprises: first storage means having a data width of j×b bits (j=natural number not less than 2); input data control means for distributing input data of the convolutional deinterleaver to bit connecting means, or second storage means, or output data control means the second storage means for delaying input data from the input data control means; the bit connecting means for connecting input data from the input data control means and input data from the second storage means to generate data to be input to the first storage means having a data width of j×b bits; address generating means for generating addresses of the first storage means; bit separating means for converting output data from the first storage means into data having a data width of b bits and to be output from the convolutional deinterleaver; and the output data control means for outputting output data from the bit separating means to the outside of the convolutional deinterleaver. Therefore, the RAM address generating means is optimized, whereby the area of the address generating circuit is minimized and the frequency of accesses to the RAM is reduced. Thereby, convolutional deinterleaving can be performed with the minimum power consumption and, moreover, it can be performed even with a RAM operating at a low frequency.

According to a twelfth aspect of the present invention, the convolutional deinterleaver of the eleventh aspect comprises the address generating means performing address generation such that the first storage means performs a delay of (C−i)S (S=a predetermined amount of delay, 0<S) for the i-th group amongst groups into which all the channels are grouped such that each group comprises at most k channels, the i-th group comprising channels from the ik-th channel to the ((i+1)k−1)-th channel (k=natural number not larger than C, i=integer satisfying the relation 0≦i≦(integer part of (C/k)), (i+1)k−1≦C; the second storage means having a capacity sufficient to perform a delay equivalent to a deficiency in the delay of the first storage means for the delay of (C−n)T (T=a predetermined amount of delay, S≦τ) to be given to the data of the n-th channel; and switching means for successively switching the channels every time data of b bits and depth m is input, such that the channel of data input to the first storage means and the second storage means is identical in channel number to the channel of the data output from the first storage means. Therefore, the same effects as described above are achieved.

According to a thirteenth aspect of the present invention, in the convolutional deinterleaver of the twelfth aspect, C is an odd number, k is 2, S and T satisfy the relation S=T, and the second delay unit performs a delay of τ for the (2h+1)-th channel (h=integer satisfying the relation 0≦2h+1≦C) and does not perform a delay for the 2h-th channel. Therefore, the same effects as described above are achieved.

According to a fourteenth aspect of the present invention, in the convolutional deinterleaver of the eleventh aspect, the second storage means and the first storage means are constructed by the same kind of storage means. Therefore, the same effects as described above are achieved.

According to a fifteenth aspect of the present invention, in the convolutional deinterleaver of the eleventh aspect, the first storage means is constructed by a RAM. Therefore, the same effects as described above are achieved.

According to a sixteenth aspect of the present invention, in the convolutional interleaver of the fifteenth aspect, the RAM has j pieces of input/output ports (j=natural number not less than 2). Therefore, the same effects at described above are achieved.

According to a seventeenth aspect of the present invention, there is provided a convolutional interleaving method for performing convolutional interleaving on a data group in which the input/output data width is b bits, the depth, i.e., the number of data in bit width units, is m, the number of channels is n, and the maximum channel number is C (n=integer satisfying the relation 0≦n≦C, b,m,C= natural numbers), and the method comprises: employing delay means which performs a delay of nT (τ=a predetermined amount of delay, T>0) for data of the n-th channel, and comprises first and second delay units; performing, by using the first delay unit, a delay of iS (S=a predetermined amount of delay, 0<S≦T) on the i-th group amongst groups into which all the channels are grouped such that each group comprises at most k channels, the i-th group comprising channels from the ik-th channel to the ((i+1)k−1)-th channel (k=natural number not larger than C, i=integer satisfying the relation 0≦i≦(integer part of (C/k)), (i+1)k−1≦C); and performing, by using the second delay unit, a delay equivalent to a deficiency in the delay of the first delay unit for the delay of nT to be given to the data of the n-th channel. Therefore, delays to be commonly generated between channels in each group are generated together by the first delay unit, and delays including differences in delays between the channels are individually generated by the second delay unit, whereby control and structure of the delay means can be simplified.

According to an eighteenth aspect of the present invention, in the convolutional interleaving method of the seventeenth aspect, C is an odd number, k is 2, S and T satisfy the relation S=T, and the second delay unit performs a delay of T for the (2h+1)-th channel (h=integer satisfying the relation 0≦2h+1≦C) and does not perform a delay for the 2h-th channel. Therefore, delays to be commonly generated between two channels in each group are generated together by the first delay unit, and a difference in delays between the two channels is generated for only one of these two channels by the second delay unit, whereby control and structure of the delay means can be simplified.

According to a nineteenth aspect of the present invention, there is provided a convolutional interleaving method for performing convolutional interleaving on a data group in which the input/output data width is b bits, the depth, i.e., the number of data in bit width units, is m, the number of channels is n, and the maximum channel number is C (n=integer satisfying the relation 0≦n≦C, b,m,C≦natural numbers), and the method comprises: employing first storage means which is able to store data having a data width of j×b bits (j=natural number not less than 2); distributing input data to bit connecting means, second storage means, or output data control means by using input data control means; delaying output data from the input data control means by using the second storage means; combining output data from the input data control means and output data from the second (storage means by using the bit connecting means to generate data to be input to the first storage means having a data width of j×b bits; generating addresses of the first storage means by address generating means; converting output data from the first storage means into convolutionally interleaved data having a data width of b bits, by using bit separating means; and outputting output data from the bit separating means by using the output data control means. Therefore, the RAM address generating means is optimized, whereby the area of the address generating circuit is minimized and the frequency of access to the RAM is reduced. Thereby, convolutional interleaving can be performed with the minimum power consumption and, moreover, it can be performed even with a RAM operating at a low frequency.

According to a twentieth aspect of the present invention, in the conventional interleaving method of the nineteenth aspect, the address generating means performs address generation such that the first storage means performs a delay of $iS$ ($S$=a predetermined amount of delay, $0<S$) on the i-th group amongst group sinto which all the channels are grouped such that each group comprises at most k channels, the i-th group comprising channels from the ik-th channel to the $((i+1)k-1)$-th channel (k=natural number not larger than C, i=integer satisfying the relation $0 \leq i \leq$(integer part of $(C/k)$), $(i+1)k-1 \leq C$); the second storage means has a capacity sufficient to perform a delay equivalent to a deficiency in the delay of the first storage means for the delay of $nT$ ($T$=a predetermined amount of delay, $S \leq T$) to be given to the data of the n-th channel; and channel switching is performed every time data of b bits and depth m is input, such that the channel of data input to the first storage means and the second storage means is identical in channel number to the channel of the data output from the first storage means. Therefore, the same effects as mentioned above are achieved.

According to a twenty-first aspect of the present invention, in the convolutional interleaving method of the twentieth aspect, C is an odd number, k is 2, S and T satisfy the relation S=T, and the second delay unit performs a delay of T for the $(2h+1)$-th channel (h=integer satisfying the relation $0 \leq 2h+1 \leq C$) and does not perform a delay for the 2h-th channel. Therefore, the same effects as described above are achieved.

According to a twenty-second aspect of the present invention, there is provided a convolutional deinterleaving method for performing convolutional deinterleaving on a data group in which the input/output data width is b bits, the depth, i.e., the number of data in bit width units, is m, the number of channels is n, and the maximum channel number is C (n=integer satisfying the relation $0 \leq n \leq C$, b,m,C= natural numbers), and the method comprises: employing delay means which performs a delay of $(C-n)T$ ($T$=a predetermined amount of delay, $T>0$) for data of the n-th channel, and comprises first and second delay units; performing, by using the first delay unit, a delay of $(C-i)iS$ ($S$=a predetermined amount of delay, $0<S \leq T$) on the i-th group amongst groups into which all the channels are grouped such that each group comprises at most k channels, the i-th group comprising channels from the ik-th channel to the $((i+1)k-1)$-th channel (k=natural) number not larger than C, i=integer satisfying the relation $0 \leq i \leq$(integer part of $(C/k)$), $(i+1)k-1 \leq C$); and performing, by using the second delay unit, a delay equivalent to a deficiency in the delay of the first delay unit for the delay of $(C-n)T$ to be given to the data of the n-th channel. Therefore, delays to be commonly generated between channels in each group are generated together by the first delay unit, and delays including differences in delays between the channels are individually generated by the second delay unit, whereby control and structure of the delay means can be simplified.

According to a twenty-third aspect of the present invention, in the convolutional deinterleaving method of the twenty-second aspect, C is an odd number, k is 2, S and T satisfy the relation S=T, and the second delay unit performs a delay of T for the $(2h+1)$-th channel (h=integer satisfying the relation $0 \leq 2h+1 \leq C$) and does not perform a delay for the 2h-th channel. Therefore, delays to be commonly generated between two channels in each group are generated together by the first delay unit, and a difference in delays between the two channels is generated for only one of these two channels by the second delay unit, whereby control and structure of the delay means can be simplified.

According to a twenty-fourth aspect of the present invention, there is provided a convolutional deinterleaving method for performing convolutional deinterleaving on a data group in which the input/output data width is b bits, the depth, i.e., the number of data in bit width units, is m, the number of channels is n, and the maximum channel number is C (n=integer satisfying the relation $0 \leq n \leq C$, b,m,C= natural numbers), and the method comprises: employing first storage means which is able to store data having a data width of j×b bits (j=natural number not less than 2); distributing input data to bit connecting means, second storage means, or output data control means by using input data control means; delaying output data from the input data control means by using the second storage means; combining output data from the input data control means and output data from the second storage means by using the bit connecting means to generate data to be input to the first storage means having a data width of j×b bits; generating addresses of the first storage means by address generating means; converting output data from the first storage means into convolutionally deinterleaved data having a data width of b bits, by using bit separating means; and outputting output data from the bit separating means by using the output data control means. Therefore, the RAM address generating means is optimized, whereby the area of the address generating circuit is minimized and the frequency of access to the RAM is reduced. Thereby, convolutional deinterleaving can be performed with the minimum power consumption and, moreover, it can be performed even with a RAM operating at a low frequency.

According to a twenty-fifth aspect of the present invention, in the convolutional deinterleaving method of the twenty-fourth aspect, the address generating means performs address generation such that the first storage means performs a delay of $(C-i)S$ ($S$=a predetermined amount of delay, $0<S$) on the i-th group amongst groups into which all the channels are grouped such that each group comprises at most k channels, the i-th group comprising channels from the ik-th channel to the $((i+1)k-1)$-th channel (k=natural number not larger than C, i=integer satisfying the relation $0 \leq i \leq$(integer part of $(C/k)$), $(i+1)k-1 \leq C$); the second storage means has a capacity sufficient to perform a delay equivalent to a deficiency in the delay of the first storage means for the delay of $(C-n)T$ ($T$=a predetermined amount of delay, $S \leq T$) to be given to the data of the n-th channel; and channel switching is performed every time data of b bits and depth m is input, such that the channel of data input to the first storage means and the second storage means is identical in channel number to the channel of the data output from the first storage means. Therefore, the same effects as described above are achieved.

According to a twenty-sixth aspect of the present invention, in the convolutional interleaving method of the twenty-fifth aspect, C is an odd number, k is 2, S and T satisfy the relation S=T, and the second delay unit performs a delay of T for the (2h+1)-th channel (h=integer satisfying the relation 0≦2h+1≦C) and does not perform a delay for the 2h-th channel. Therefore, the same effects as described above are achieved.

DETAILED DESCRIPTION OF THE PREFERRED EMBODIMENTS

Hereinafter, embodiments of the present invention will be described with reference to FIGS. 1 through 12.

[Embodiment 1]

In a convolutional interleaver according to a first embodiment of the invention, address counters for a RAM are combined for every two channels as a unit, thereby reducing the circuit scale of the peripheral unit of the RAM and its power consumption.

Figure 1:
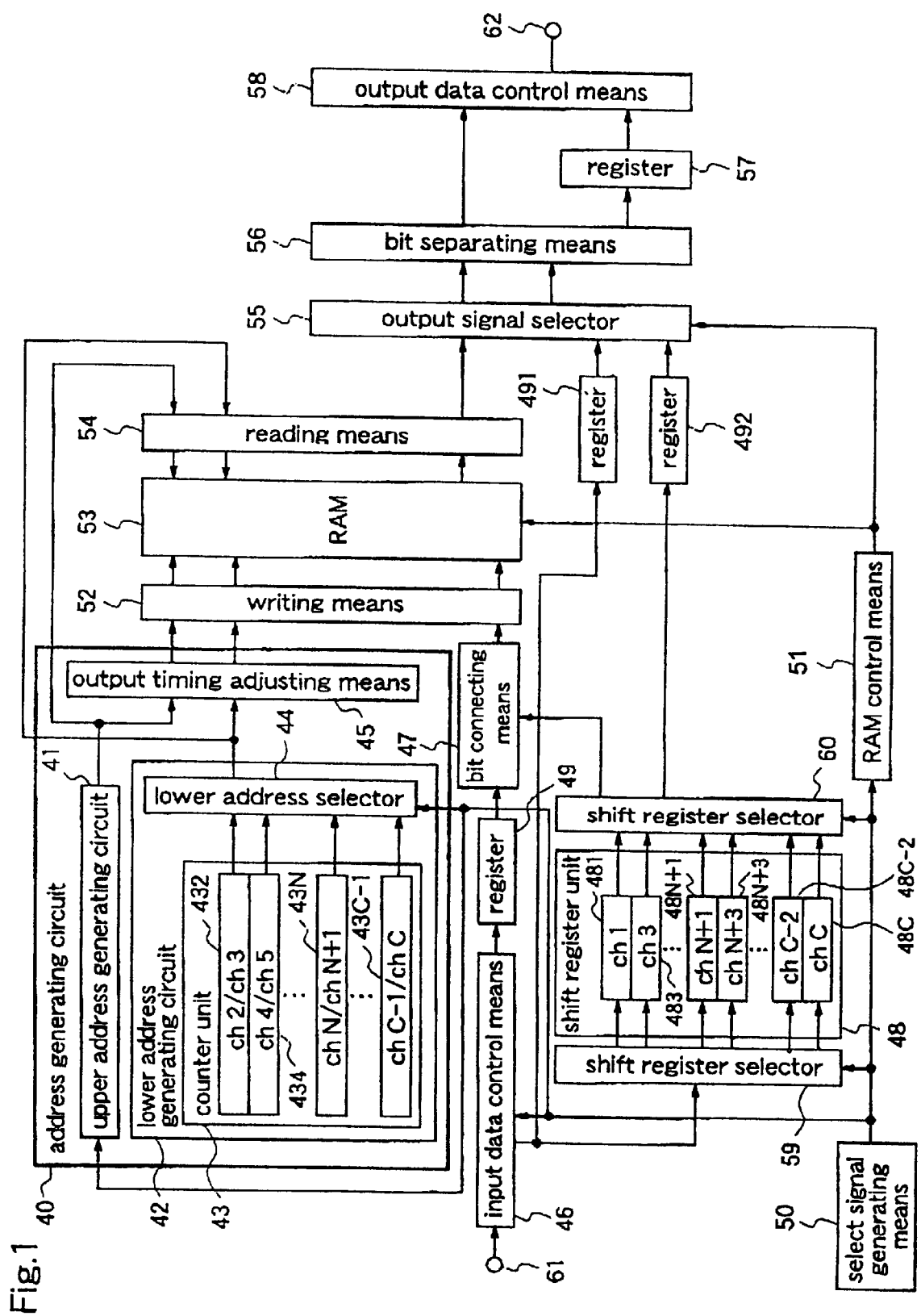
FIG. 1 is a block diagram illustrating a convolutional interleaver according to a first embodiment of the present invention.

FIG. 1 is a block diagram illustrating the structure of a convolutional interleaver according to the first embodiment.

With reference to FIG. 1, the convolutional interleaver comprises a single port RAM 53 (i.e., first storage means), an input data control means 46, a select signal generating means 50, a shift register storage 59, a shift register unit 48 (i.e., second storage means), a shift register selector 60, a register 49, registers 491 and 492, a bit connecting means 47, an upper address generating means 41, a lower address generating means 42, an output timing adjusting means 45, a writing means 52, a reading means 54, an output signal selector 55, a bit separating means 56, a register 57, an output data control means 58, and a RAM control means 51.

The single port RAM 53 outputs data to the reading means 54. The input data control means 46 outputs input data 61 of the convolutional interleaver to the register 49, the output signal selector 55, and the shift register selector 59. The select signal generating means 50 outputs a control signal to the input data control means 46, the upper address generating means 41, the lower address selector 44, the shift register selectors 59 and 60, and the RAM control means 51. The shift register selector 59 outputs data to the shift register unit 48. The shift register unit 48 comprises shift registers 481, 483~48C-2, 48C corresponding to channels ch1, ch3~chC-2, chC, respectively, and outputs data of the shift registers in groups, each corresponding to two channels, to the shift register selector 60. The shift register selector 60 outputs data to the bit connecting means 47. The register 49 outputs data to the bit connecting means 47. The register 491 retains output data from the input data control means 46 and outputs the data to the output signal selector 55. The register 492 retains output data from the shift register selector 60 and outputs the data to the output signal selector 55. The bit connecting means 47 outputs data to the writing means 52 of the RAM 33. The upper address generating means 41 outputs an upper address of the RAM 53 to the writing means 52 through the output timing adjusting means 45. The lower address generating means 42 outputs a lower address of the RAM 53 to the writing means 52 through the output timing adjusting means 45. The output timging adjusting means 45 outputs an address and a control singal to the writing means 52. The writing means 52 outputs data, an address, and a control signal to the RAM 53. The reading means 54 outputs an address and a control signal to the RAM 53 and outputs data to the output signal selector 55. The output signal selector 55 outputs data to the bit separating means 56. The bit separating means 56 outputs data to the output data control means 58 and the register 57. The register 57 outputs data to the output data control means 58. The output data control means 58 outputs an output 62 of the convolutional interleaver to the outside. The RAM control means 51 controls the RAM 53 and the output signal selector 55.

The lower address generating means 42 comprises a counter unit 43 and a lower address selector 44. The counter unit 43 comprises counters 432, 434~43N~43C-1 corresponding to channels ch2/ch3, ch4/ch5~chN/chN+1~chC-1/chC, respectively. The counter unit 43 outputs lower address in groups, each group corresponding to two channels, to the lower address selector 44. The lower address selector 44 outputs the lower address to the output timing adjusting means 45.

The select signal generating means 50 and the address generating means 40 serve as an input side selector in the operation principle described later. Further, the output signal selector 55 and the address generating means 40 serve as an output side selector in the operation principle.

Figure 2:
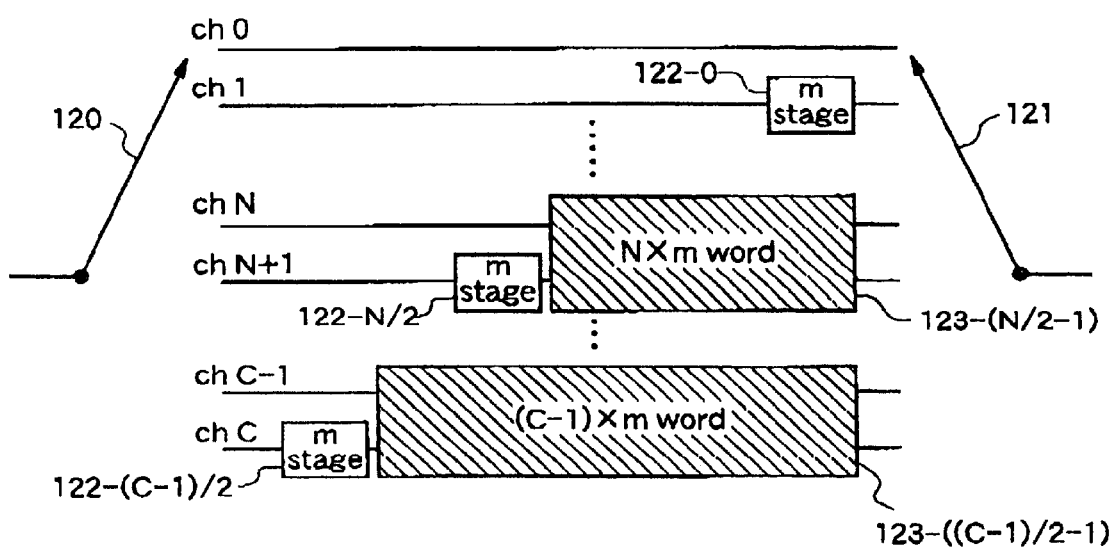
FIG. 2 is a diagram for explaining the operation of the convolutional interleaver of the first embodiment.
Figure 3:
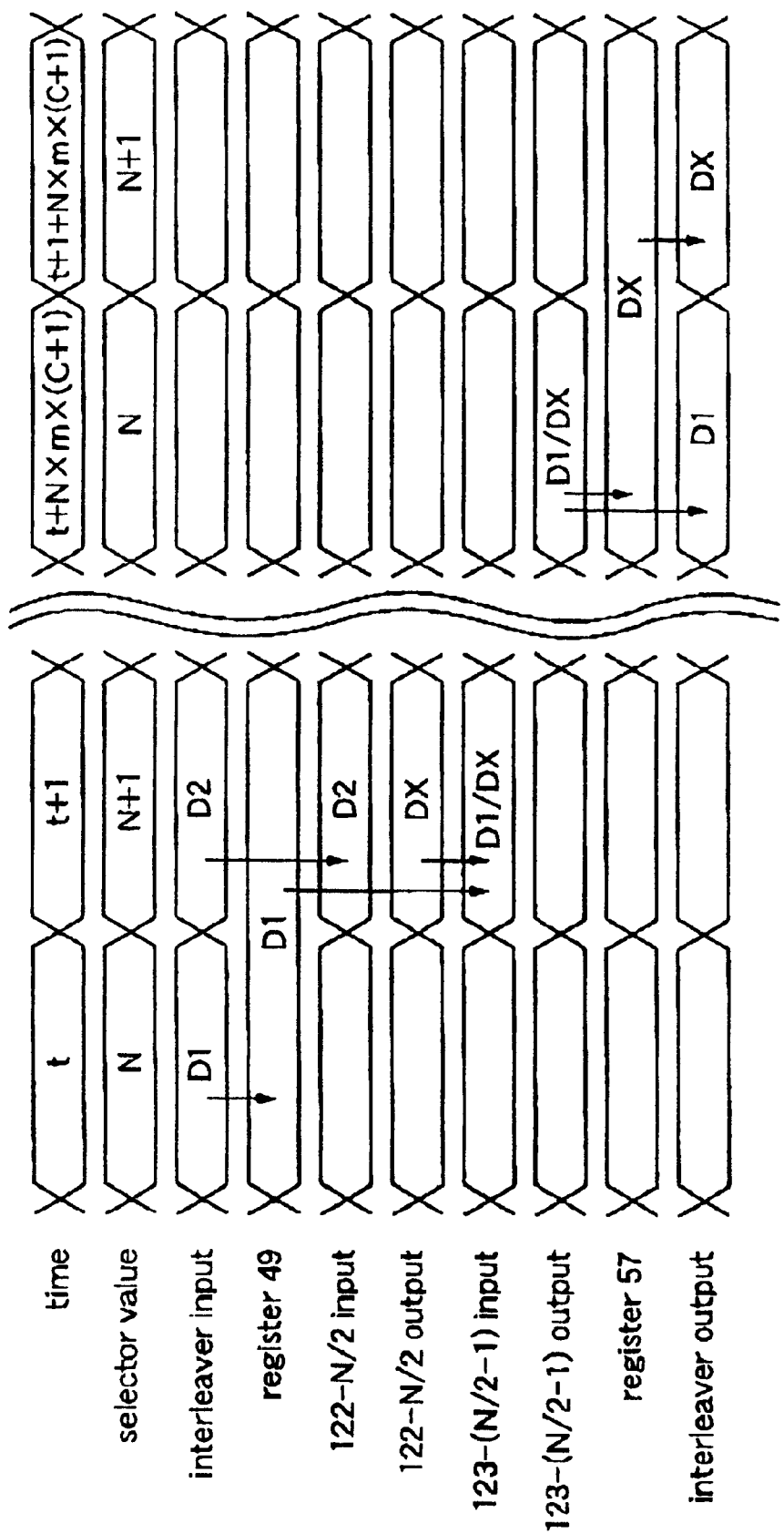
FIG. 3 is a timing chart of the convolutional interleaver of the first embodiment.

Hereinafter, the operation principle of the convolutional interleaver according to this first embodiment will be described with reference to FIG. 2 and timing chart 3.

Figure 16:
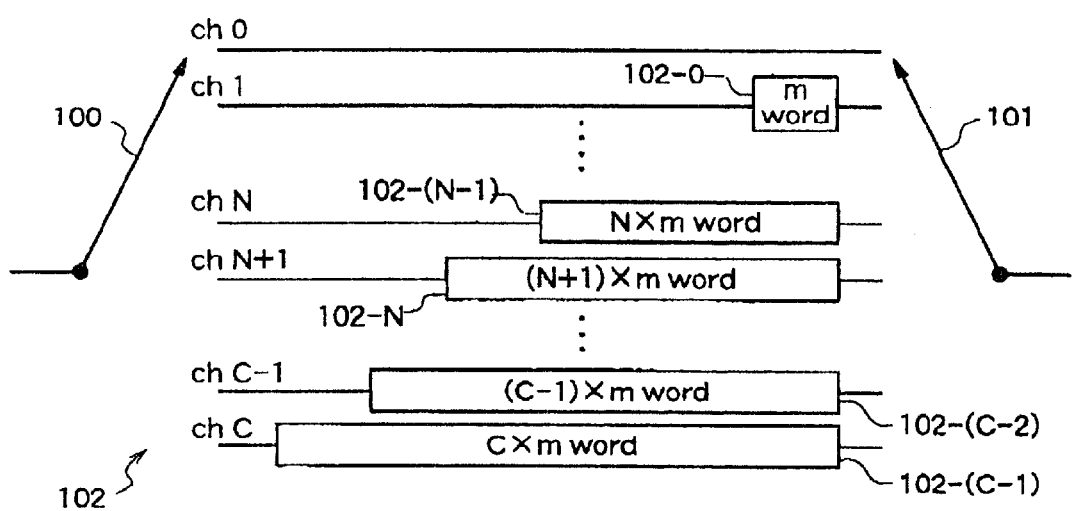
FIG. 16 is a diagram for explaining the operation of the convolutional interleaver of FIG. 15.
Figure 17:
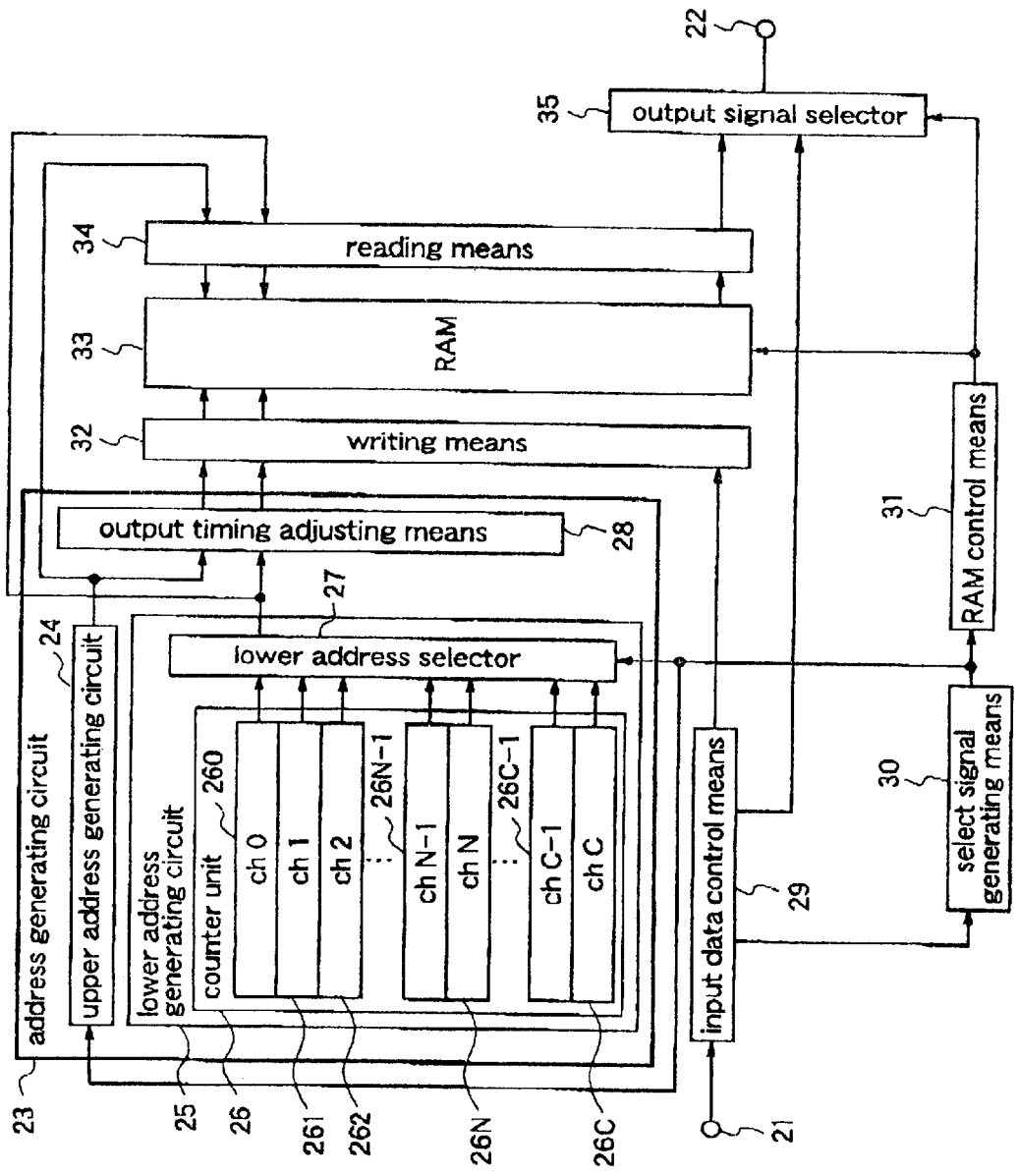
FIG. 17 is a block diagram illustrating a convolutional deinterleaver according to another prior art.

The convolutional interleaver of this first embodiment is realized by replacing the storage areas 102-0, ..., 102-(C-1) shown in FIG. 16 with shift registers (i.e., second delay unit) 122-0, ..., 122-(C-1)/2 and storage areas (i.e., first delay unit) inside the single port RAM (bit width 2$b$), ..., 123-)N/2-1), ..., 123-((C-1)/201), and employing selectors 120 and 121 which circularly switch the channels. These selectors 120 and 121 start from ch0, successively increment the channel number, and return to ch0 when reaching chC to repeat the same operation as above.

Initially, both of the selectors 120 and 121 select channel ch0. Since no delay element exists at this channel, the signal at ch0 travels through the convolutional interleaver without being delayed.

Next, the selectors 120 and 121 select chN. The data of this channel is retained by a register (not shown) until the next channel chN+1 is selected. The data of chN and the data of chN+1 are simultaneously input to the RAM 123-(n/2-1), and the data of chN is delayed by N(>1) times as much as the delay at ch1 by the RAM 123-(N/2-1), to be output.

At chN+1, the same delay as that at ch1 by the shift register 122-0 is made by the shift register 122-N/2, and a delay N(>-1) times as much as that at ch1 is added to this delay by the RAM 123-(N/2-1). Consequently, a signal delayed by (N+1) times as much as the delay at ch1 is output.

Thereafter, the selectors 120 and 121 select chC. At this channel, the same delay as that at ch1 by the shift register 122-0 is made by the shift register 122-(C-1)/2, and a delay C-1 (>N) times as much as that at ch1 is added to this delay by the RAM 123-((C-1)/2-1). Consequently, a signal delayed by C times as much as the delay at ch1 is output.

At the next point of time, the selectors 120 and 121 select ch0 again to repeat the above-mentioned operation.

More specifically, when the selectors 120 and 121 select the channel chN at time t, the input data of the convolutional interleaver is input to the input data control means 46, and this data is retained by the register 49. At time t+1 (the selectors 120 and 121 select the channel chN+1), the input data of the convolutional interleaver is input to the shifter register 122-N/2, and the sifter register 122-N/2 performs shifting, whereby the output of the input data control means 46 and the output of the register 49 are simultaneously written in the single port RAM 123-(N/2-1), as the lower b bit and the upper b bit, respectively, by the bit connecting means 47. At time t+N×m×(C-1, these data are read simultaneously, and the upper b bit is output from the convolutional interleaver while the lower b bit is stored in the register 57, by the bit separating means 56 and the output data control means 58. At time t+1+N×m×(C+1), the output of the register 57 is output from the conventional interleaver by the output data control means 58. By repeating the above-described processing, convolutional interleaving is realized.

Next, the operation of the convolutional interleaver of this first embodiment will be described with reference to FIG. 1.

The convolutional interleaver captures input data to be interleaved from the input data terminal 61 by the input data control means 46, and writes the data into the RAM 53 by the writing means 52. At this time, one address counter is assigned to two channels (ch) of b-bit data. Then, the counters 432~43N~43C-1 of the lower address generating means 42 corresponding to ch2 and ch3 (hereinafter, ch2/ch3)~chN-1 and chN (chN-1/chN)~chC-1 and chC (chc-1/chC), respectively, count the lower addresses of the RAM 53. The lower address selector 44 selects one of these counters composing the counter unit 43 of the lower address generating means 42, in accordance with the control signal generated by the select signal generating means 50. The lower address so selected and the upper address of the RAM 53 output from the upper address generating means 41 are input to the output timing adjusting means 45, wherein their output timing are adjusted, and thereafter these addresses are input to the writing means 52 to give a write address to the RAM 53.

At this time, initially, data of ch0 is input and, at the next point of time, data of ch1 is input. The select signal generating means 50 controls the input data control means 46 so that the data of ch0 is transmitted not through the RAM 53 but through the register 491 directly to the output signal selector 55. Further, the RAM control means 51 under control of the select signal generating means 50 controls the output signal selector 55 so that the selector 55 selects the non-delayed data, which has been sent from the input data control means 46 directly to the output signal selector 55, and outputs this data from the output terminal 62 to the outside.

Further, with respect to the data of ch1, the data from the input data control means 46 is delayed by a predetermined delay time T (>0) according to the capacity of the shift register 481 of ch1 which is selected by the shift register selectors 59 and 60, and the delayed data is input to the register 492. The RAM control means 61 under control of the select signal generating means 50 controls the output signal selector 55 so that it selects the data delayed by the ch1 shift register 481 and supplied from the register 492 and outputs the data from the output terminal 62 to the outside.

Further, with respect to data of ch2~chN~chC, storage areas for these data are set in the RAM 53 by the upper address generating means 41 and the counter unit of the lower address generating means 42 such that the sizes of these storage areas increase in order of the channels, each by a delay time 2T, with two channels as a unit, and these storage areas are successively selected by an upper address selector (not shown) and the lower address selector 44 for every two channels as a unit. With respect to the channels to which the channels of b-bit data are sequentially applied, the following operation is performed on each storage area for every two channels. That is, the data is written in an address in the storage area and, at the next point of time, the data is read from the address and written in the next address.

Further, with respect to odd channels of ch1, ch3~chN+1, chN+3~chC, the shift register selectors 59 and 60 successively select the shift registers of the corresponding channels, for every two channels, from the shift register unit 48. The capacities of these shift registers are set in advance such that the capacities correspond to the increments in delay time T from the even channels ch0, ch2~chN-1~chC-1, and the data output from the shift register selector 60 are connected to the data of the even channels ch0, ch2~chN-1~chC-1 by the bit connecting means 47 via the register 49, whereby gradually increasing delay times can be given to the data of the channels ch0~chN~chC.

After the data of ch1 has been input, the data of ch2 is input and, at the next point of time, the data of ch3 is input. With respect to the data of ch2, the select signal generating means 50 controls the operation as follows. That is, the input data control means 46 inputs this data to the register 49, the register 49 compensates the data of ch2 so that this data arrives the bit connecting means 47 simultaneously with the data of ch3 delayed by the shift register 483, the bit connecting means 47 connects the data of ch2 and the data of ch3, and these data of ch2 and ch3 so connected are input to the RAM 53.

At this time, the select signal generating means 50 controls the upper address generating means 41 so that it generates an address of the storage area of the RAM 53 corresponding to ch2, and controls the lower address selector 44 so that it selects the output of the counter 432 in the counter unit 43 of the lower address generating means 42 to output an address of the storage area corresponding to ch3. The output timing adjusting means 45 adjusts the timing to output the addresses of the storage areas corresponding to ch2 and ch3, and outputs these addresses to the writing means 52 for the RAM 53.

Thereby, the data of ch2/ch3 are written in the storage area of the RAM 53 corresponding to ch2/ch3.

Further, the RAM control means 51 under control of the select signal generating means 50 selects the data which has been delayed by 2T and transmitted from the RAM 53 through the reading means 54 to the output signal selector 55.

The data of ch2 and the data of ch3 simultaneously output from the output signal selector 55 are separated by the bit separating means 56. The data of ch2 is output through the output data control means 58 and the output terminal 62 to the outside.

The data of ch3 is input to the register 57 and delayed by a predetermined delay time T(>0). Then, the data from the register 57 is output through the output data control means 58 and the output terminal 62 to the outside.

Thereby, the data of ch3 is given a delay which is longer by the predetermined delay time T(>0) than that of the data of ch2.

Thereafter, by the same operation as described above, delay times equivalent to even-multiples of T are given to the even channels by the RAM 53 while delay times equivalent to odd-multiples of T are given to the odd channels by the shift registers and the RAM 53.

While in the prior art convolutional interleaver one address-generating circuit is needed for each channel, in the structure of this embodiment one address-generating circuit is needed for two channels. Therefore, the address generating circuits are reduced to ½, resulting in a considerable reduction in circuit scale. Further, while in the prior art one read/write process is needed for one channel of input data in the single port RAM, in the first embodiment one read/write process is needed for two channels of input data, resulting in a reduction in power consumption. Further, since the frequency at which the RAM is accessed is reduced, even a RAM operating at a relatively low operating frequency can be employed. Moreover, since the shaft registers 122 (see FIG. 2) are used in combination with the single port RAM, the address generating unit of the RAM is simplified, whereby address generation of the RAM is facilitated.

While in this first embodiment two channels are united as one group and one address-generating circuit is assigned to one group, one address-generating circuit may be assigned to three or more channels.

Generally, the input/output data width is b bits, the depth (the number of data in bit width units) is m, the number of channels is n, and the maximum channel number is C (n is an integer satisfying the relation $0 \leq n \leq C$, and b, m, C are natural numbers).

Especially when the convolutional interleaver of this embodiment is applied to DVB specification, C=11, i.e., the number of channels is 12, and the depth is 17. Further, when applied to American ground wave specification, C=51, i.e., the number of channels is 52, and the depth is 4.

Further, while in this first embodiment a delay equivalent to a difference in delays between two adjacent channels to given by the shift register, a delay larger than this difference may be given by the shift register.

Moreover, while in this first embodiment a single port RAM is employed, a multiple port RAM may be employed for high speed 1/0.

[Embodiment 2]

In a convolutional deinterleaver according to a second embodiment of the invention, address counters for a RAM are combined for every two channels as a unit, thereby reducing the circuit scale of the peripheral unit of the RAM and its power consumption.

Figure 4:
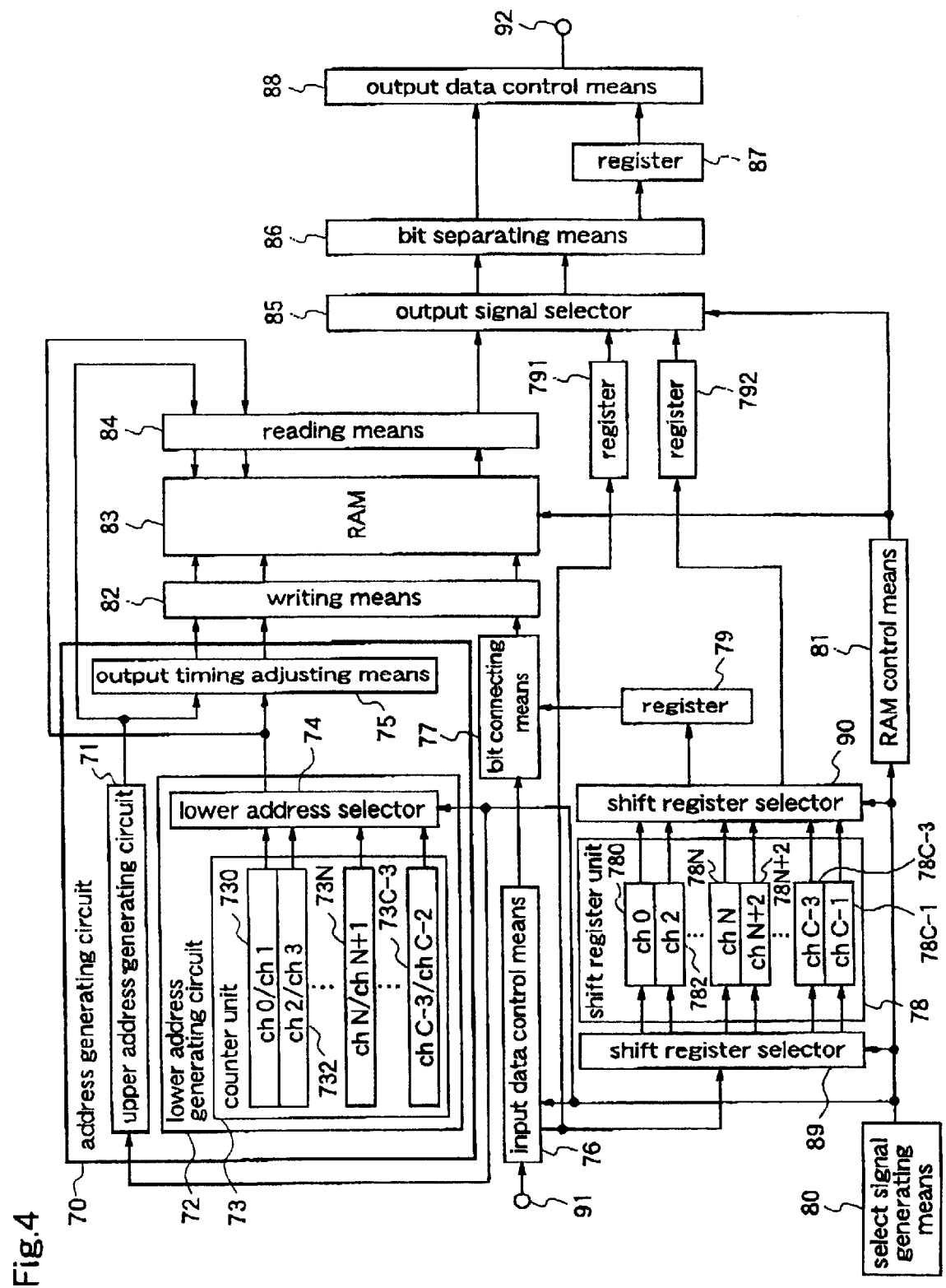
FIG. 4 is a block diagram illustrating a convolutional deinterleaver according to a second embodiment of the present invention.

FIG. 4 is a block diagram illustrating the structure of a convolutional deinterleaver according to the second embodiment.

With reference to FIG. 4, the convolutional deinterleaver comprises a single port RAM 83 (i.e., first storage means), an input data control means 76, a select signal generating means 80, a shift register select 89, a shift register unit 78 (i.e., second storage means), a shift register selector 90, a register 79, registers 791 and 792, a bit connecting means 77, an upper address generating means 71, a lower address generating means 72, an output timing adjusting means 75, a writing means 82, a reading means 84, an output signal selector 85, a bit separating means 86, a register 87, an output data control means 88, and a RAM control means 81.

The single port RAM 83 outputs data to the reading means 84. The input data control means 76 outputs input data 91 of the convolutional deinterleaver to the bit connecting means 77, the register 791, and the shift register selector 89. The select signal generating means 80 outputs a control signal to the input data control means 76, the upper address generating means 71, the lower address selector 74, the shift register selectors 89 and 90, and the RAM control means 81. The shift register selector 89 outputs data to the shift register unit 78. The shift register unit 78 comprises shift registers 780, 782~78N, 78N+2~78C-3, 78C-1 corresponding to channels ch0, ch2~chN, chN+2~chC-3, chc-1, respectively, and outputs data from the shift registers in groups, each group corresponding to two channels, to the shift register selector 90. The shift register selector 90 outputs data to the register 79 and the register 792. The register 79 outputs data to the bit connecting means 77. The register 791 retains the output data from the input data control means 76 and outputs the data to the output signal selector 85. The register 792 retains the output data from the shift register selector 90 and outputs the data to the output signal selector 85. The bit connecting means 77 outputs data to the writing means 82 of the RAM 83. The upper address generating means 71 outputs an upper address of the RAM 83 to the writing means 82 through the output timing adjusting means 75. The lower address generating means 72 outputs a lower address of the RAM 83 to the writing means 82 through the output timing adjusting means 75. The output timing adjusting means 75 outputs an address and a control signal to the writing means 82. The writing means 82 outputs data, an address, and a control signal to the RAM 83. The reading means 84 outputs an address and a control signal to the RAM 83 and outputs data to the output signal selector 85. The output signal selector 85 outputs data to the bit separating means 86. The bit separating means 86 outputs data to the output data control means 88 and the register 87. The register 87 outputs data to the output data control means 88. The output data control means 88 outputs an output 92 of the convolutional deinterleaver to the outside. The RAM control means 81 controls the RAM 83 and the output signal selector 85.

The lower address generating means 72 comprises a counter unit 73 and a lower address selector 74. The counter unit 73 comprises counters 730, 732~73N~73C-3 corresponding to channels ch0/ch2, chN/chN+2~chN/chN+1~chC-3/chC 2, respectively. The counter unit 43 outputs lower addresses in groups, each group corresponding to two channels, to the lower address selector 74. The lower address selector 74 outputs the lower address to the output timing adjusting means 75.

The select signal generating means 80 and the address generating means 70 serve as an input side selector in the operation principle described later. Further, the output signal selector 85 and the address generating means 70 serve as an output side selector in the operation principle.

Figure 5:
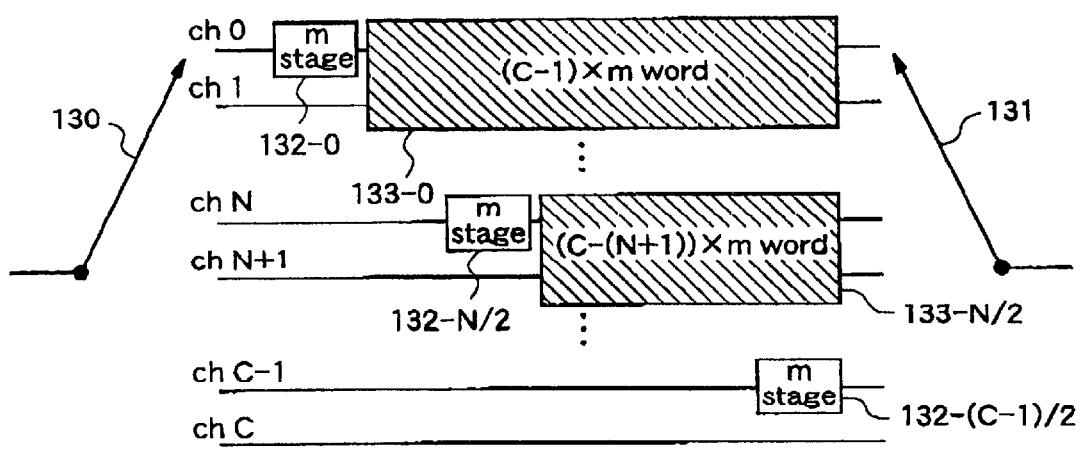
FIG. 5 is a diagram for explaining the operation of the convolutional deinterleaver of the second embodiment.
Figure 6:
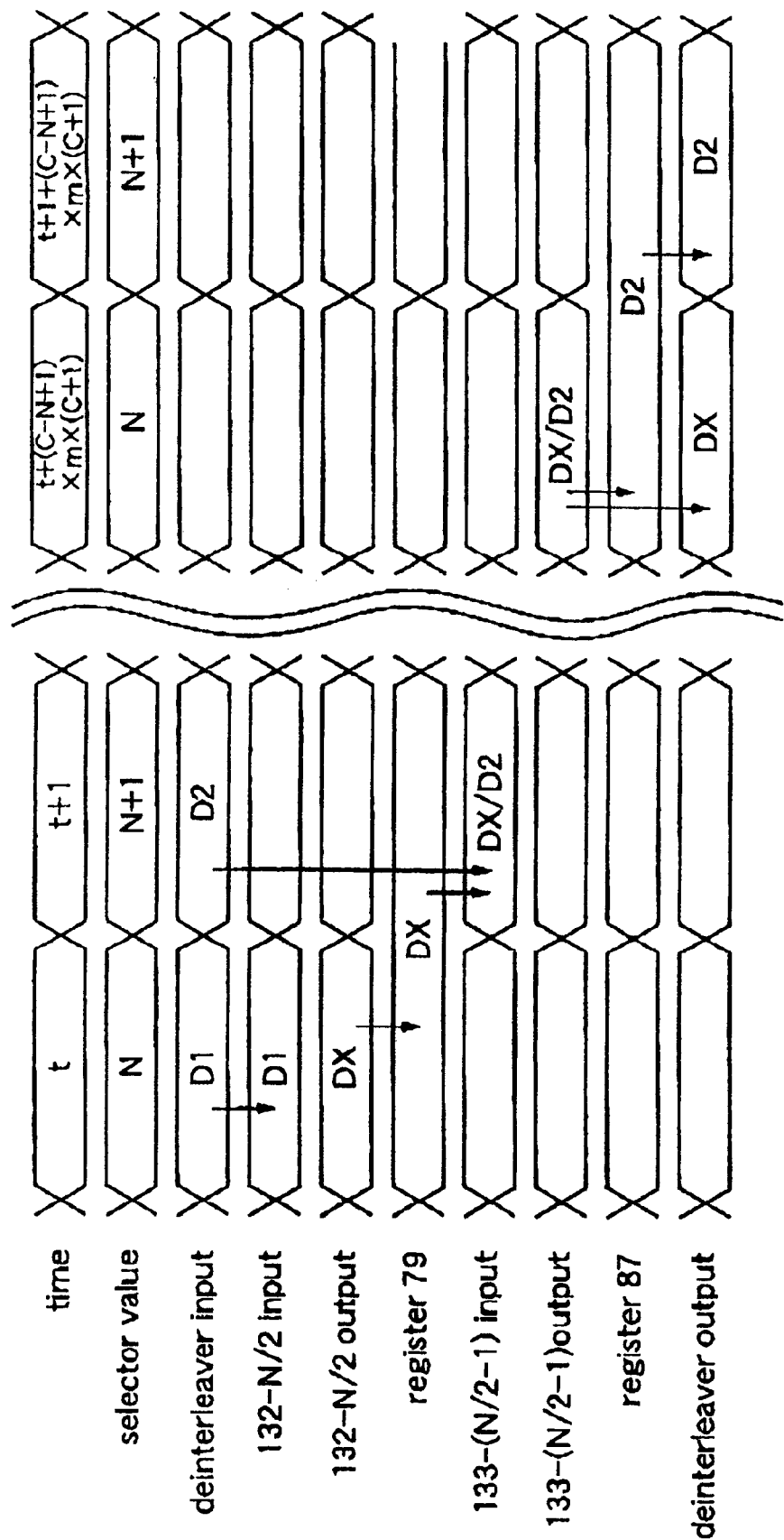
FIG. 6 is a timing chart of the convolutional deinterleaver of the second embodiment.

Hereinafter, the operation principle of the convolutional deinterleaver according to this second embodiment will be described with reference to FIG. 5 and timing chart 6.

Figure 18:
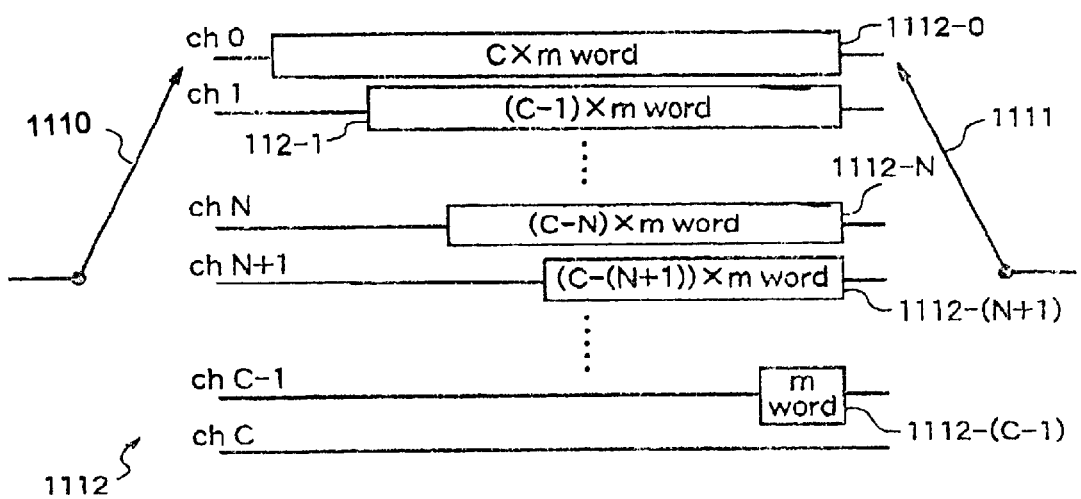
FIG. 18 is a diagram for explaining the operation of the convolutional deinterleaver of FIG. 17.

The convolutional deinterleaver of this second embodiment is realized by replacing the storage areas 1112-0, . . . , 1112-(C-1) shown in FIG. 18 with shift registers (i.e., second delay unit) 132-0, . . . , 132-(C-1)/2 and storage areas (i.e., first delay unit) inside the single port RAM (bit width 2b), 133-0, . . . , 133-N/2, . . . , and employing selectors 130 and 131 which circularly switch the channels. These selectors 130 and 131 start from ch0, successively increment the channel number, and return to ch0 when reaching chC to repeat the same operation as above.

Initially, both of the selectors 130 and 131 select channel ch0. At this channel, a delay as much as that at chC-1 by the shift register 132-(C-1)/2) (described later) is made by the shift register 132-0, and the data of ch0 is retained by a register (not shown) until the next channel ch1 is selected. The data of ch0 and the data of ch1 are simultaneously input to the RAM 133-0, and these data are delayed by C-1(>N) times as much as a delay at chC-1 which is described later.

Therefore, at the channel ch0 where the shift register 132-0 exists, a signal delayed by C times as much as the delay at chC-1 is output. With respect to ch1, since no shift register 132-0 exists for this channel, a signal delayed by C-1 times as much as the delay at chC-1 is output.

Then, the selectors 130 and 121 select chN. At this channel, a signal delayed by C-N(>1) times as much as the delay at ch1 by the shift register 132-N/2 and the RAM 133-N/2 is output.

Further, the data selected at chN+1 is input to the RAM 133-N/2 together with the data selected at chN. Since no shift register 132-N/2 exists at chN+1, a signal delayed by C-(N+1) (>1) times as much as the delay at ch1 by the RAM 133-N/2 is output.

Further, at chC-1, a delay is made by only the shift register 132-(C-1)/2), and the data of chC-1 is retained in the register 792 to be compensated by the delay of the register 79.

Thereafter, the selectors 130 and 131 select chC. Since no delay element exists at this channel except the register 791 that compensates the delay of the register 79, the signal of chC travels through the convolutional deinterleaver without being subjected to the original delay.

At the next point of time, the selectors 130 and 131 select ch0 again to repeat the above-mentioned operation.

More specifically, when the selectors 130 and 131 select the channel chN at time t, the input data of the convolutional deinterleaver is input to the shift register 132-N/2 for this channel chN, the shift register 132-N/2 performs shifting, and the output of the shift register 132-N/2 is stored in the register 78. At time t+1 (the selectors 130 and 131 select the channel chN+1), the output data from the register 79 and the input data to the convolutional deinterleaver are simultaneously written in the single port RAM 133, as the lower b bit and the upper b bit, respectively. At time t+(C-(N+1))×m×(C+1), these data are read simultaneously, and the upper b but is output from the convolutional deinterleaver while the lower b bit is stored in the register 87. At time t+1+(C-(N+1)×m×(C+1), the output of the register 87 is output from the convolutional deinterleaver. By repeating the above-described process, convolutional deinterleaving is realized.

Next, the operation of the convolutional deinterleaver of this second embodiment will be described with reference to FIG. 4.

The convolutional deinterleaver captures input data to be deinterleaved from the input data terminal 91 by the input data control means 76, and writes this data into the RAM 83 by the writing means 82. At this time, one address counter is assigned to every two channels (ch) of b-bit data. Then, the counters 730~73N~73C-1 of the lower address generating means 72 corresponding to ch0 and ch1 (hereinafter, ch0/ch1)~chN-1 and chN (chN-1/chN)~chC-3 and chC-2 (chC-3/chC-2), respectively, count the lower addresses of the RAM 83. The lower address selector 74 selects one of these lower addresses. The lower address so selected and the upper address of the RAM 83 output from the upper address generating means 71 are input to the output timing adjusting means 75, wherein their output timings are adjusted, and thereafter, input to the writing means 82 to give a write address to the RAM 83.

At this time, initially, data of ch0 is input and, at the next point of time, data of ch1 is input. With respect to data of ch2~chN~chC, storage areas for these data are set in the RAM 83 by the upper address generating means 71 and the counter unit of the lower address generating means 72 such that the sizes of these storage areas increase in order of the channels, each by a delay time 2T (>0), with two channels as a unit, and these storage areas are successively selected by an upper address selector (not shown) and the lower address selector /4 for every two channels as a unit. With respect to the channels to which two channels of b-bit data are sequentially applied, the following operation is performed on each storage area for every two channels. That is, the data is written in an address in the storage area and, at the next point of time, the data is read from the address and written in the next address.

Further, with respect to the odd channels of ch1, ch3~chN+1, chN+3~chC, the shift register selectors 89 and 90 successively select the shift registers of the corresponding channels, for every two channels, from the shift register unit 78, under control of the select signal generating means 80. The capacities of these shift registers are set in advance such that the capacities correspond to the increments in delay time T from the even channels ch0, ch2~chN-1~chC-1, and the data output from the shift register selector 90 are connected to the data of the even channels ch0, ch2~chN-1~chC-1 by the bit connecting means 77 via the register 79, whereby gradually increasing delay times can be given to the data of ch0~chN~chC.

Accordingly, with respect to the data of ch0, the control of the select signal generating means 80 controls the input data control means 76 and the shift register selectors 89 and 90 so that this data is delayed by a predetermined delay time T(>0) according to the capacity of the shift register 780 for ch0 selected by the shift register selectors 89 and 90, to be input to the register 79.

The register 79 retains the data of ch0 until the data of ch1 arrives through the input data control means 76, and the bit connecting means 77 connects the data of ch0 from the register 79 and the data of ch1 from the input data control means 76 to output the connected data to the writing means 82 of the RAM 83.

At this time, the select signal generating means 80 controls the upper address generating means /1 so that it generates an initial address of the storage area of the RAM 83 corresponding to ch0, and controls the lower address selector 74 so that it selects the output of the counter 730 in the counter unit 73 of the lower address generating means 72 to output an address of the storage area correspondig to ch1. The output timing adjusting means 75 adjusts the timings to output these addresses of the storage area corresponding to ch0/ch1, and outputs these addresses to the writing means 82 for the RAM 83.

Thereby, the data of ch0/ch1 are written in the storage areas of the RAM 83 corresponding to ch0/ch1.

Further, the RAM control means 81 under control of the select signal generating means 80 selects the data which has been delayed by (C−1)T and transmitted from the RAM 83 through the reading means 84 to the output signal selector 85.

The data of ch0 and the data of ch1 simultaneously output from the output signal selector 85 are separated by the bit separating means 86. The data of ch0 is input to the register 87 and delayed by a predetermined delay time T (>0). Then, the data from the register 87 is output through the output data control means 88 and the output terminal 92 to the outside.

Further, the data of ch1 is output, as it is, through the output data control means 88 and the output terminal 92 to the outside.

Thereby, the data which have been delayed by a predetermined delay time CT by the shift register 780 and the RAM 83 is output from the terminal 92.

Thereafter, by the same operation as described above, delay times equivalent to odd-multiples of T are given to the even channels by the RAM 83 while delay times equivalent to even-multiples of T are given to the odd channels by the shift registers and the RAM 83.

Furthermore, with respect to the data at chC-1, the data from the input data control means 76 is delayed by a predetermined delay time T (>0) according to the capacity of the shift register 78C-1 for chC-1 which is selected by the shift register selectors 89 and 90, to be input to the register 792. The RAM control means 81 under control of the select signal generating means 80 controls the output signal selector 85 so that it selects the data delayed by the shift register 78C-1 and supplied from the register 792 and outputs the data from the output terminal 92 to the outside.

With respect to the data at chC, the select signal generating means 80 controls the input data control means 76 so that it sends this data not through the RAM 83 but through the register 791 directly to the output signal selector 85. Further, the RAM control means 81 under control of the select signal generating means 80 controls the output signal selector 85 so that it selects the data, which has not been subjected to the original delay and has been sent from the input data control means 76 directly to the output signal selector 85, and outputs the data from the output terminal 92 to the outside.

Thereby, the respective channels ch0~chN~chC are given gradually decreasing delay times by the convolutional deinterleaver shown in FIG. 4 whereas these channels have been given gradually increasing delay times by the convolutional interleaver shown in FIG. 1. Synthetically, the same delay time is given to all the channels, whereby the data array which has been interleaved by the convolutional interleaver shown in FIG. 1 is deinterleaved (restored) by the convolutional deinterleaver shown in FIG. 4.

While in the prior art convolutional interleaver one address-generating circuit is needed for each channel, in the structure of this second embodiment one address-generating circuit is needed for two channels. Therefore, the address generating circuits are reduced to ½, resulting in a considerable reduction in circuit scale. Further, while in the prior art one read/write process is needed for one channel of input data in the single port RAM, in this second embodiment one read/write process is needed for two channels of input data, resulting in a reduction in power consumption. Further, since the frequency at which the RAM is accessed is reduced, even a RAM operating at a relatively low operating frequency can be employed. Moreover, since the shift registers 132 (see FIG. 5) are used in combination with the single port RAM, the address generating unit of the RAM is simplified, whereby address generation of the RAM is facilitated.

While in this second embodiment two channels are united as one group and one address-generating circuit is assigned to one group, one address-generating circuit may be assigned to three or more channels.

Generally, the input/output data width is b bits, the depth (the number of data in bit width units) is m, the number of channels is n, and the maximum channel number is C (n is an integer satisfying the relation $0 \leq n \leq C$, and b, m, C are natural numbers).

Especially when the convolutional deinterleaver of this embodiment is applied to DVB specification, C=11, i.e., the number of channels is 12, and the depth is 17. Further, when applied to American ground wave specification; C=51, i.e., the number of channels is 52, and the depth is 4.

Further, while in this second embodiment a delay equivalent to a difference in delays between two adjacent channels is given by the shift register, a delay larger than this difference may be given by the shift register.

Moreover, while is this second embodiment a single port RAM is employed, a multiple port RAM may be employed for high speed I/O.

[Embodiment 3]

In a convolutional interleaver according to a third embodiment of the invention, address counters for a RAM are combined for every two channels as a unit, thereby reducing the circuit scale of the peripheral unit of the RAM and its power consumption. Further, since all delays are realized by the RAM alone, the convolutional interleaver can be constructed without mixing different kinds of storage units.

Figure 7:
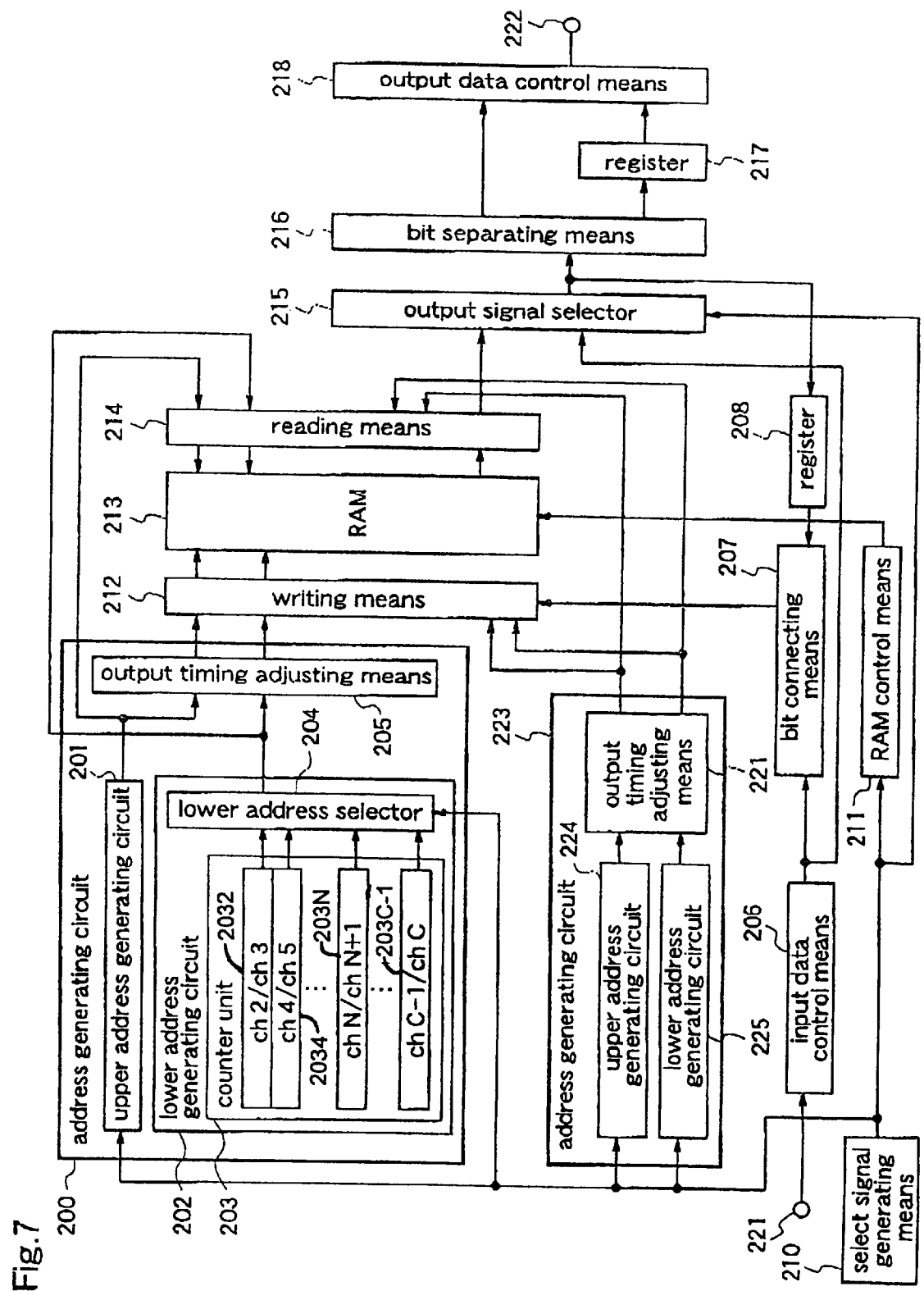
FIG. 7 is a block diagram illustrating a convolutional interleaver according to a third embodiment of the present invention.

FIG. 7 is a block diagram illustrating the structure of a convolutional interleaver according to the third embodiment.

With reference to FIG. 7, the convolutional interleaver comprises a single port RAM 213 (i.e., storage means), an input data control means 206, a register 208, a bit connecting means 207, a select signal generating means 210, a RAM control means 211, an address generating means 200, a writing means 212, a reading means 214, an output signal selector 215, a bit separating means 216, a register 217, and an output data control means 218.

The single port RAM 213 outputs data to the reading means 214. The input data control means 206 outputs input data 221 of the convolutional interleaver to the bit connecting means 207 and the output signal selector 215. The register 208 outputs data to the bit connecting means 207. The bit connecting means 207 outputs data to the writing means 212. The select signal generating means 210 outputs a control signal to the address generating means 200, the address generating means 223, the RAM control means 211, and the output signal selector 215. The RAM control means 211 outputs a control signal to the RAM 213. The address generating means 200 outputs a RAM address to the writing means 212 and the reading means 214. The writing means 212 outputs a RAM address and data to the RAM 213. The reading means 214 outputs a RAM address to the RAM 213 and outputs data to the output signal selector 215. The output signal selector 215 outputs data to the register 208 and the bit separating means 216. The bit separating means 216 outputs data to the output data control means 218 and the register 217. The register 217 outputs data to the output data control means 218. The output data control means 218 outputs data 222 as the output of the interleaver.

The address generating means 200 comprises an upper address generating means 201, a lower address generating means 202, and an output timing adjusting means 205. The upper address generating means 201 generates an upper address of the RAM 213 according to a select signal generated by the select signal generating means 210 and outputs the upper address to the output timing adjusting means 205. The lower address generating means 202 generates a lower address of the RAM 213 according to a select signal generated by the select signal generating means 210 and outputs the lower address to the output timing adjusting means 205. The output timing adjusting means 205 outputs a RAM address to the writing means 212 and the reading means 214.

The lower address generating means 202 comprises a counter unit 203 and a lower address selector 204. The counter unit 203 comprises counters 2032, 2034~203N~203C-1 corresponding to channels ch2/ch3, ch4/ch5~chN/chN+1~chC-1/chC; respectively. The counter unit 203 outputs lower addresses for every two channels to the lower address selector 204. The lower address selector 204 outputs the lower addresses to the output timing adjusting means 205.

Further, the address generating means 223 comprises an upper address generating means 224, a lower address generating means 225, and an output timing adjusting means 221. The upper address generating means 224 outputs a RAM upper address to the output timing adjusting means 221, and the lower address generating means 225 outputs a RAM lower address to the output timing adjusting means 221. The output timing adjusting means 221 outputs a RAM address to the writing means 212 and the reading means 214.

The select signal generating means 210, the address generating means 200, and the address generating means 223 serve as an input side selector in the operation principle described later. Further, the output signal selector 215, the address generating means 200, and the address generating means 223 serve as an output side selector in the operation principle.

Hereinafter, the operation principle of the convolutional interleaver according to this third embodiment will be described with reference to FIG. 8 and timing chart shown in FIG. 9.

Figure 8:
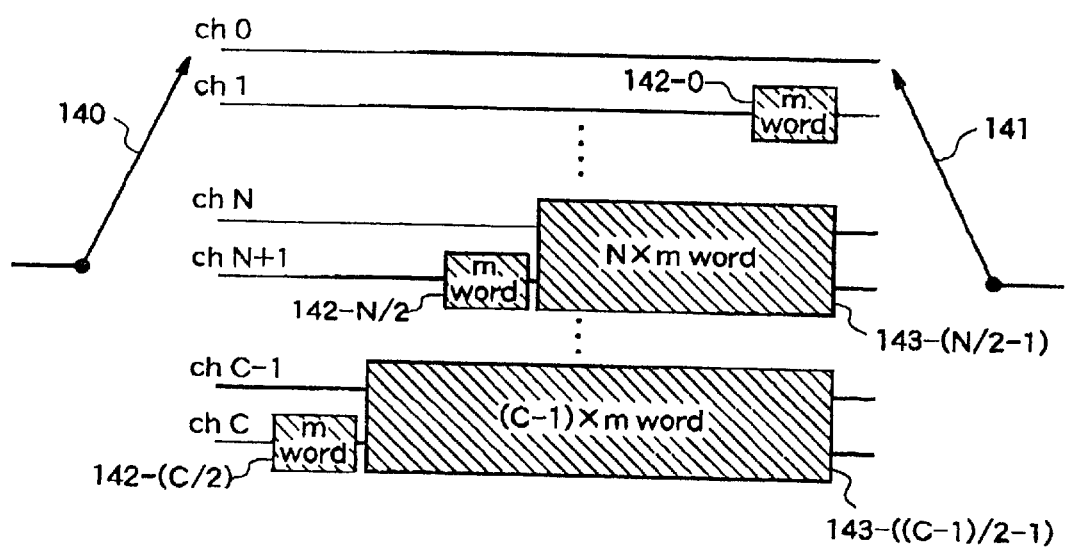
FIG. 8 is a diagram for explaining the operation of the convolutional interleaver of the third embodiment.
Figure 9:
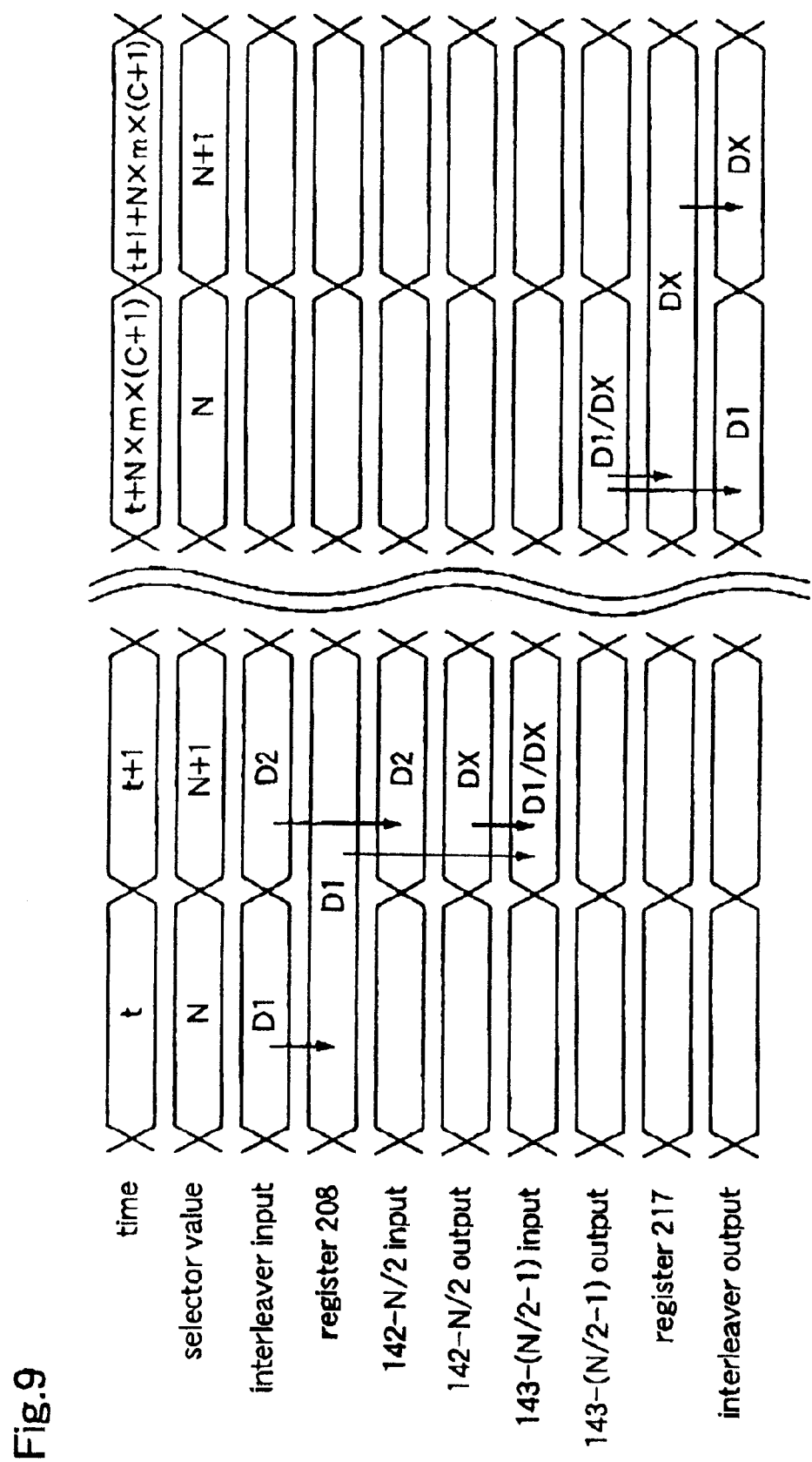
FIG. 9 is a timing chart of the convolutional interleaver of the third embodiment.

The convolutional interleaver of this third embodiment is realized by replacing the storage areas 5102-0, . . . , 102-(C−1) shown in FIG. 16 with storage areas inside the single port RAM (bit width b) 142-0, . . . , 142-C/2 and storage areas inside the single port RAM (bit width 2b) . . . , 143-(N/2−1), . . . , 143-(C−1)/2−1) shown in FIG. 8, and employing selectors 140 and 141 which circularly switch the channels. These selectors 140 and 141 start from ch0, successively increment the channel number, and return to ch0 when reaching chC to repeat the same operation as above.

In this third embodiment, the storage areas 142-0, . . . , 142-C/2 may be included in another RAM, separated from the storage areas 143-(N/2−1), . . . , 143-((C−1)/201). When these storage areas 142-0, . . . , 142-C/2 and 143-(N/2−1), . . . , 143-((C−1)/2−1) are included in the same RAM, the storage areas 142-0, . . . , 142-C/2 may be combined by twos to make the bit width equal to that of the storage areas 143-(N/2−1), . . . , 143-((C−1)/2−1).

Initially, both of the selectors 140 and 141 select channel ch0. Since no original delay element exists at this channel, the signal at ch0 travels through the convolutional interleaver without being subjected to the original delay.

Next, the selectors 140 and 141 select ch1. At this channel, an FIFO is implemented by the storage area 142-0 inside the RAM 213, and a signal delayed by this storage area 142-0 is output.

Then, the selectors 140 and 141 select chN. The data of chN is retained by a register (not shown) until the next channel chN+1 is selected, and the data of chN is delayed by N(>1) times as much as the delay at ch1 by the storage area 143-(N/2−1) in the RAM 213.

At chN+1, the same delay as that at ch1 by the storage area 142-0 of the RAM 213 is made by the storage area 142-N/2 of the RAM 213 and, in addition, a delay N(>1) times as much as that at ch1 is made by the storage area 143-(N/2−1) of the RAM 213. Consequently, a signal delayed by (N+1) times as much as the delay at ch1 is output.

Thereafter, the selectors 140 and 141 select chC. At this channel, the same delay as that at ch1 by the storage area 142-0 of the RAM 213 is made by the storage area 142-(C−1)/2 of the RAM 213, and a delay C−1(>N) times as much as that at ch1 is made by the storage area 143-((C−1)/2−1) of the RAM 213. Consequently, a signal delayed by C times as much as the delay at ch1 is output.

At the next point of time, the selectors 140 and 141 select ch0 again to repeat the above-mentioned operation.

More specifically, when the selectors 140 and 141 select the channel chN at time t, the input data control means 206 stores the input data 221 of the convolutional interleaver shown in FIG. 7 into the register 208 via the output signal selector 215. At time t+1 (the selectors 140 and 141 select the channel chN+1), the oldest data is read from the storage area 142-N/2 of the RAM 213, and the input data of the convolutional interleaver is written in the address from which the data has been read. Further, the read data and the output of the register 208 are simultaneously written in the storage area 143-(N/2−1) of the RAM 213, as the lower b bit and the upper b bit, respectively. At time t+N×m×(C+1), these data are read simultaneously, and the upper b bit is output from the convolutional interleaver while the lower b bit is stored in the register 217. At time t+1+N×m×(C+1), the output of the register 217 is output from the convolutional interleaver. By repeating the above-described processing, convolutional interleaving is realized.

Next, the operation of the convolutional interleaver of this third embodiment will be described.

The convolutional interleaver captures input data to be interleaved from the input data terminal 221 by the input data control means 206, and writes the data into the RAM 213 by the writing means 212. At this time, one address counter is assigned to two channels (ch) of b-bit data. Then, the counters 2032~203N~203C-1 of the lower address generating means 202 corresponding to ch2 and ch3 (hereinafter, ch2/ch3)~chN−1 and chN (chN−1/chN)~chC-1 and (chC-1/chC), respectively, count the lower addresses of the RAM 213. The lower address selector 202 selects one of these counters. The lower address so selected and the upper address of the RAM 213 output from the upper address generating means 201 are input to the output timing adjusting means 205, wherein their output timings are adjusted, and thereafter these addresses are input to the writing means 212 to give a write address to the RAM 213.

At this time, initially, data of ch0 is input and, at the next point of time, data of ch1 is input. The select signal generating means 210 controls the input data control means 206 so that the data of ch0 is transmitted not through the RAM 213 but directly to the output signal selector 215. Further, the RAM control means 211 under control of the select signal generating means 210 controls the output signal selector 215 so that the selector 215 selects the non-delayed data which has been sent from the input data control means 206 directly to the output signal selector 215.

Further, with respect to the data of ch1, the data of ch0 transmitted from the output signal selector 215 to the register 208 is combined with the data of ch1 output from the input data control means 206 by the bit connecting means 207. The RAM control means 211 under control of the selector signal generating means 210 controls the RAM 213 so that the connected data of ch0 and ch1 are simultaneously written in the RAM 213 via the writing means 212. At this time, the select signal generating means 210 and the RAM control means 211 perform the following operation on each storage area for every two channels. That is, the upper address and the lower address generated by the address generating means 223 are used as addresses of the RAM 213 and, with respect to the addresses generated by the address generating means 223, data is written in an address in each storage area and, at the next point of time, the data is read from the address to be written in another address. Thereby, the data of ch0 and ch1 are delayed by a predetermined time by the RAM 213 operating as an FIFO.

The data of ch0 and ch1 simultaneously read from the RAM 213 are input to the bit separating means 216 via the output signal selector 215 under control of the select signal generating means 210, and the data of ch0 is output as it is to the output data control means 218 while the data of ch1 is output through the register 217 and the output terminal 222 to the outside. Thereby, delays equivalent to the delays made by the shift register unit shown in FIG. 1 are realized.

Further, with respect to data of ch2~chN~chC, under control of the select signal generating means 210, storage areas for these data are set in the RAM 213 by the upper address generating means 201 and the counter unit of the lower address generating means 202 such that the sizes of these storage areas increase in order of the channels, with two channels as a unit, and these storage areas are successively selected by an upper address selector (not shown) and the lower address selector 204 for every two channels as a unit. With respect to the channels to which two channels of b-bit data are sequentially applied, the following operation is performed on each storage area for every two channels. That is, the data is written in an address in the storage area and, at the next point of time, the data is read from the address to be written in the next address.

Furthermore, with respect to the odd channels ch1, ch3~chN+1, chN+3~chC, under control of the select signal generating means 210, the address generating means 223 performs address generation by using the storage areas of the RAM 213 such that a delay time, which is equivalent to a difference between delay times to be possessed by an odd channel and an even channel adjacent to the odd channel, is generated.

Thereby, a delay time 2T/3T is given to ch2/ch3, . . . , and a delay time (C-3)T/(C-2)T is given to chC-3/chC-2.

This operation is to make the same delay as that given by the shift register unit shown in FIG. 1, by using the RAM 213.

Thereby, a delay time T is given to ch1, ch3, . . . , chC-2, chC, respectively.

Therefore, the address generating means 223 generates delay times equivalent to those given by the shift register unit 48 shown in FIG. 1 in which the shift registers corresponding to the respective channels are successively selected for every two channels and these shift registers have the capacities equivalent to the increment in delay time from the even channels ch0, ch2~chN-1~chC-1, whereby gradually increasing delay times are given to the data at the channels ch0~chN~chC.

That is, the data of chN is, like the data of ch0, input to the register 208 by the output signal selector 215, and connected with the data of chN+1 by the bit connecting means 207 to be input to the RAM 213.

In the RAM 213, storage areas corresponding to chN and chN+1 are set by the address generating means 223 and 200, and the data of the chN and chN+1 are respectively delayed by a delay time (N+1)T in these areas.

Then, the data of chN and chN+1 are simultaneously read from the RAM 213 to be input to the bit separating means 216 under control of the output signal selector 205.

The bit separating means 216 immediately outputs the data of chN through the output data control means 218 to the output terminal 222. On the other hand, the data of chN+1 is temporarily stored in the register 217, and then it is output through the output data control means 218 to the output terminal 222.

Accordingly, by successively selecting the channels from ch0 to chC under control of the select signal generating means 210, delay times which increase T by T with the increments in the channel number can be given to the respective channels.

While in the prior art convolutional interleaver one address-generating circuit is needed for each channel, in the structure of this embodiment one address-generating circuit is needed for two channels. Therefore, the address generating circuits are reduced to ½, resulting in a considerable reduction in circuit scale. Further, since the address generating circuits can be implemented by using only a RAM without using shift registers, integration of higher density is realized as compared with the first embodiment of the invention.

Further, while in the prior art one read/write process is needed for one channel of input data in the single port RAM, in this third embodiment one read/write process is needed for two channels of input data, resulting in a reduction in power consumption. Further, since the frequency at which the RAM is accessed is reduced, even a RAM operating at a relatively low operating frequency can be employed.

While in this third embodiment two channels are united as one group and one address-generating circuit is assigned to one group, one address-generating circuit may be assigned to three or more channels.

Generally, the input/output data width is b bits, the depth (the number of data in bit width units) is m, the number of channels is n, and the maximum channel number is C (n is an integer satisfying the relation $0 \leq n \leq C$, and b, m, C are natural numbers).

Especially when the convolutional interleaver of this embodiment is applied to DVB specification, C=11, i.e., the number of channels is 12, and the depth is 17. Further, when applied to American ground wave specification, C=51, i.e., the number of channels is 52, and the depth is 4.

Further, while in this third embodiment a delay equivalent to a difference in delays between two adjacent channels is given not by shift registers but by a storage area of the RAM, a delay larger than the difference between channels may be given by this storage area of the RAM.

Moreover, while in this third embodiment a single port RAM is employed, a multiple port RAM may be employed for high speed I/O.

[Embodiment 4]

In a convolutional deinterleaver according to a fourth embodiment of the invention, address counters for a RAM are combined for every two channels as a unit, thereby reducing the circuit scale of the peripheral unit of the RAM and its power consumption. Further, since all delays are realized by the RAM alone, the convolutional deinterleaver can be constructed without mixing different kinds of storage units.

Figure 10:
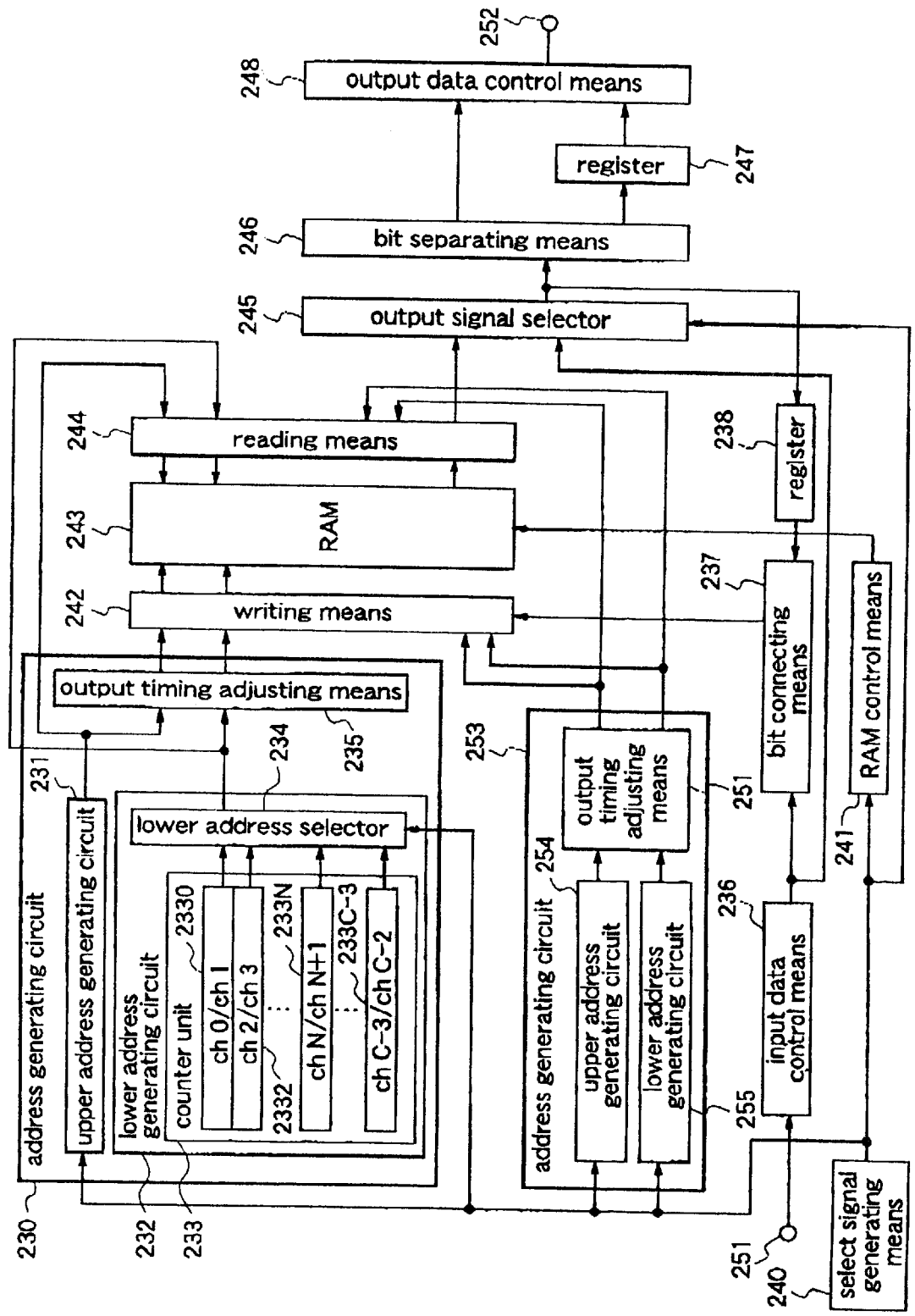
FIG. 10 is a block diagram illustrating a convolutional deinterleaver according to a fourth embodiment of the present invention.

FIG. 10 is a block diagram illustrating the structure of a convolutional interleaver according to the fourth embodiment.

With reference to FIG. 10, the convolutional deinterleaver comprises a single port RAM 243 (i.e. storage means), an input data control means 236, a register 238, a bit connecting means 237, a select signal generating means 240, a RAM control means 241, an address generating means 253, a writing means 242, a reading means 244, an output signal selector 245, a bit separating means 246, a register 247, and an output data control means 248.

The single port RAM 243 outputs data to the reading means 244. The input data control means 236 outputs input data 251 of the convolutional deinterleaver to the bit connecting means 237 and the output signal selector 245. The register 238 outputs data to the bit connecting means 237. The bit connecting means 237 outputs data to the writing means 242. The select signal generating means 240 outputs a control signal to the address generating means 230, the address generating means 253, the RAM control means 241, and the output signal selector 245. The RAM control means 241 outputs a control signal to the RAM 243. The address generating means 253 outputs a RAM address to the writing means 242 and the reading means 244. The writing means 242 outputs a RAM address and data to the RAM 243. The reading means 244 outputs a RAM address to the RAM 243 and outputs data to the output signal selector 245. The output signal selector 245 outputs data to the register 238 and the bit separating means 246. The bit separating means 246 outputs data to the output data control means 248 and the register 247. The register 247 outputs data to the output data control means 248. The output data control means 248 outputs output data 252 of this deinterleaver.

The address generating means 230 comprises an upper address generating means 231, a lower address generating means 232, and an output timing adjusting means 235. The upper address generating means 231 generates an upper address of the RAM 243 according to a select signal generated by the select signal generating means 240 and outputs the upper address to the output timing adjusting means 235. The lower address generating means 232 generates a lower address of the RAM 243 and outputs the lower address to the output timing adjusting means 235. The output timing adjusting means 235 outputs a RAM address to the writing means 242 and the reading means 244.

The lower address generating means 232 comprises a counter unit 233 and a lower address selector 234. The counter unit 233 comprises counters 2330, 2332~233N~233C-3 corresponding to channels ch0/ch1, ch2/ch3~chN/chN+1~chC-3/chC-2, respectively. The counter unit 233 outputs lower addresses for every two channels to the lower address selector 234. The lower address selector 234 outputs the lower addresses to the output timing adjusting means 235.

Further, the address generating means 253 comprises an upper address generating means 254, a lower address generating means 255, and an output timing adjusting means 251. The upper address generating means 254 outputs an upper address of the RAM 243 to the output timing adjusting means 251, and the lower address generating means 255 outputs a lower address of the RAM 243 to the output timing adjusting means 251. The output timing adjusting means 251 outputs an address of the RAM 243 to the writing means 242 and the reading means 244.

The select signal generating means 240, the address generating means 230, and the address generating means 253 serve as an input side selector in the operation principle described later. Further, the output signal selector 245, the address generating means 230, and the address generating means 253 serve as an output side selector in the operation principle.

Hereinafter, the operation principle of the convolutional deinterleaver according to this fourth embodiment will be described with reference to FIG. 11 and timing chart 12.

Figure 11:
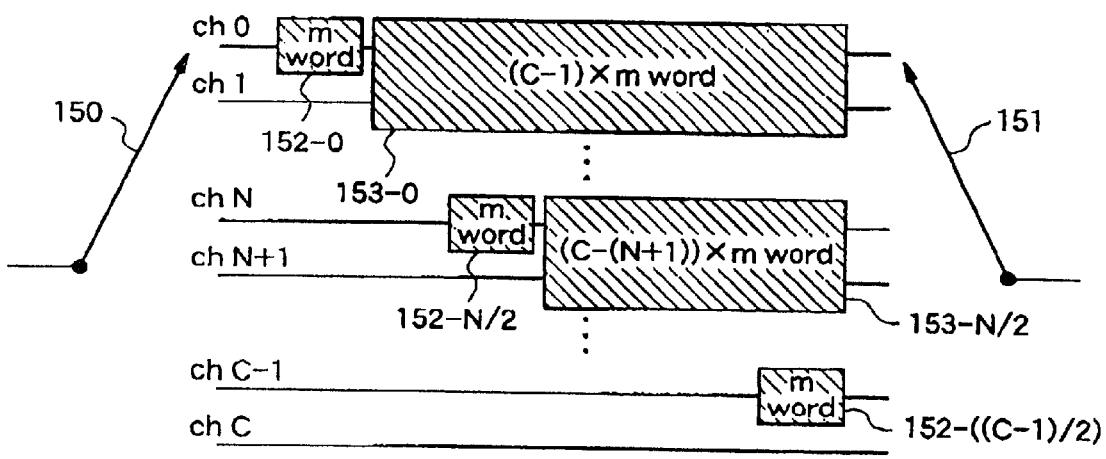
FIG. 11 is a diagram for explaining the operation of the convolutional deinterleaver of the fourth embodiment.
Figure 12:
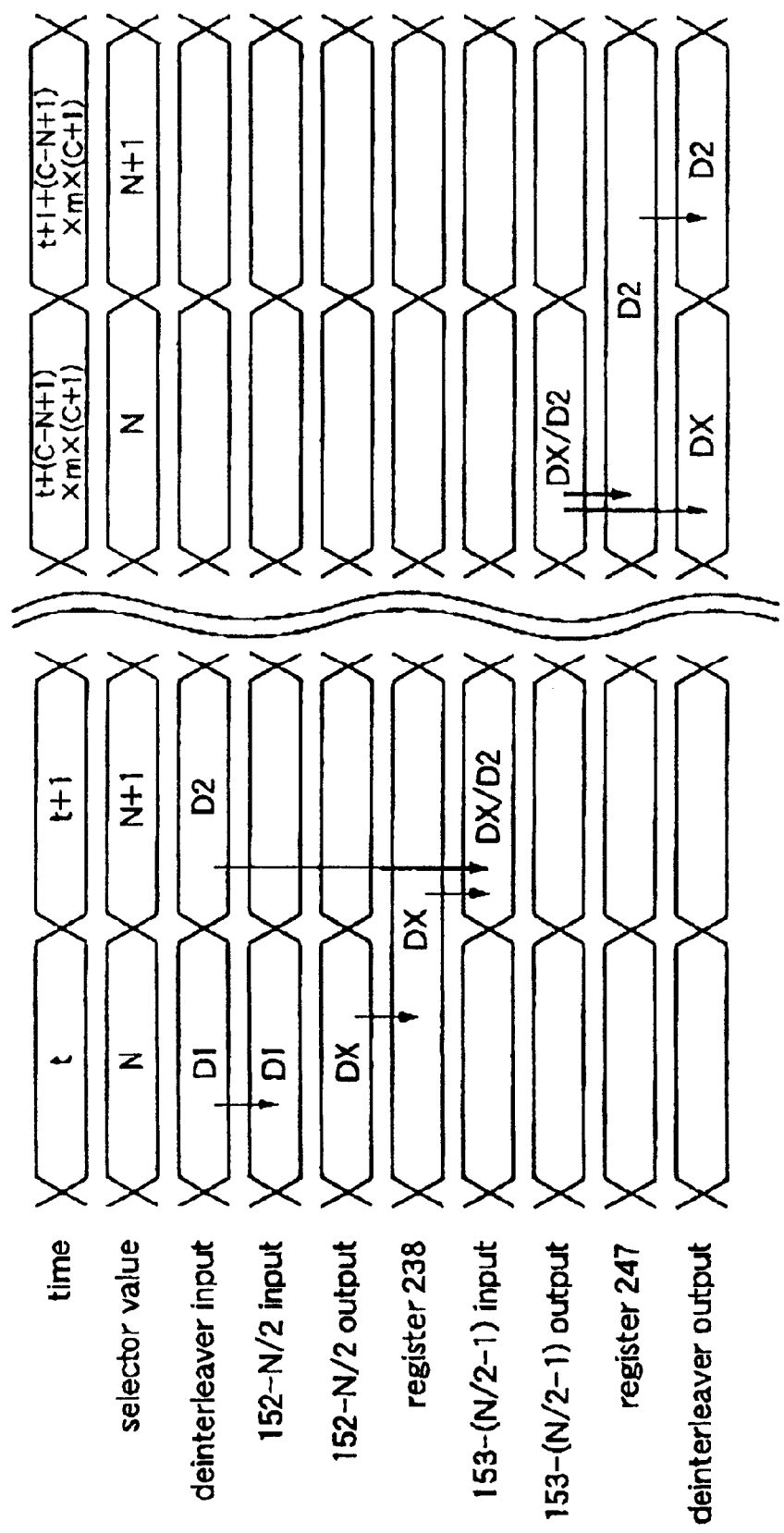
FIG. 12 is a timing chart of the convolutional deinterleaver of the fourth embodiment.
Figure 13:
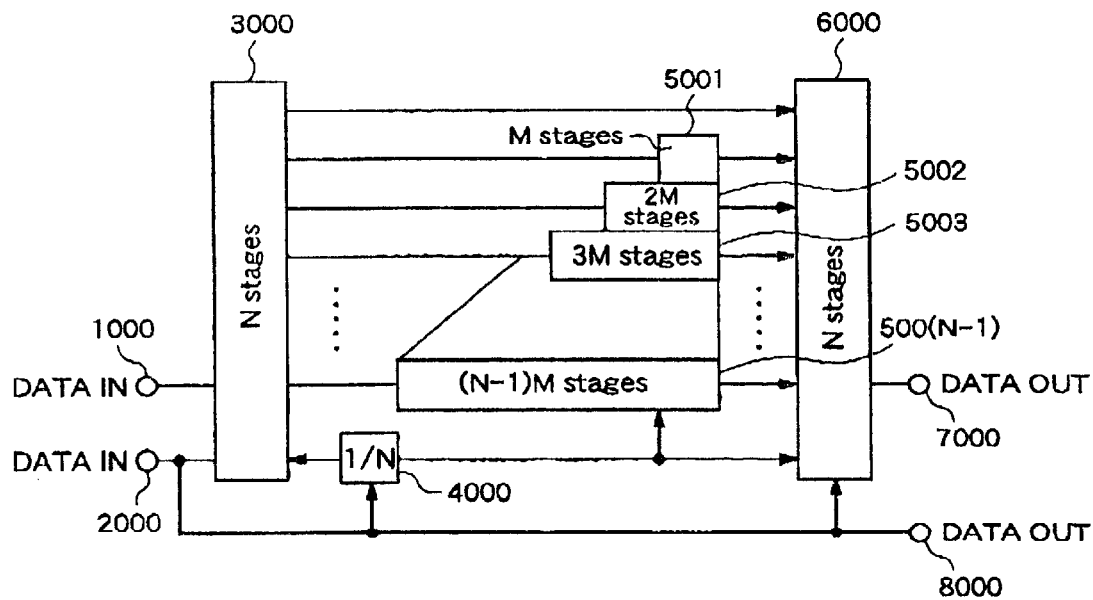
FIG. 13 is a block diagram illustrating a convolutional interleaver disclosed in, for example, Japanese Published Patent Application No. Hei. 7-170201.
Figure 14:
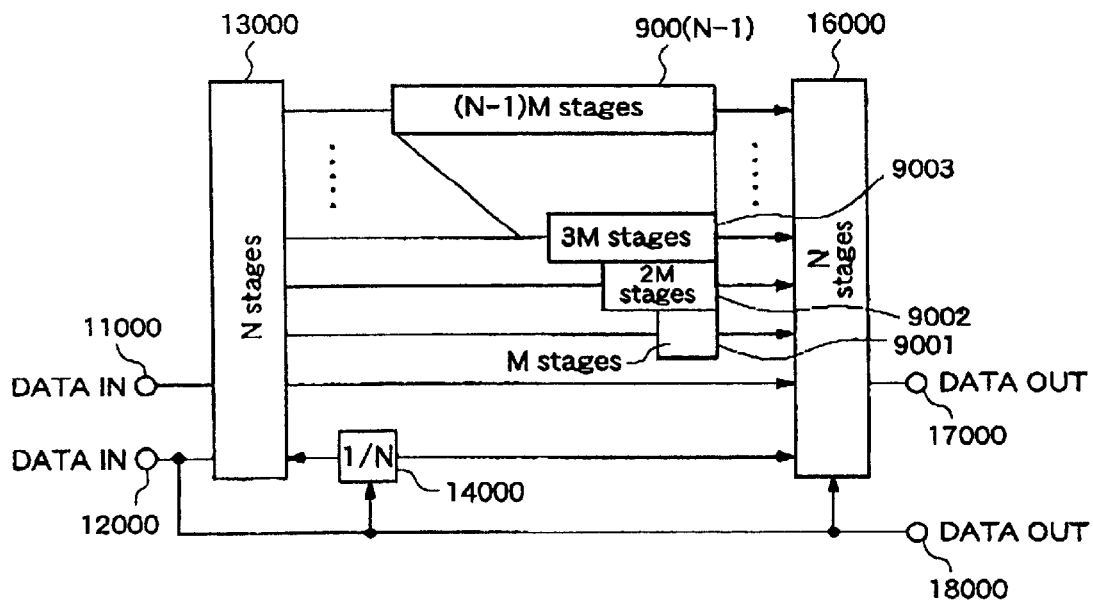
FIG. 14 is a block diagram illustrating a convolutional deinterleaver estimated from the convolutional interleaver of FIG. 13.
Figure 15:
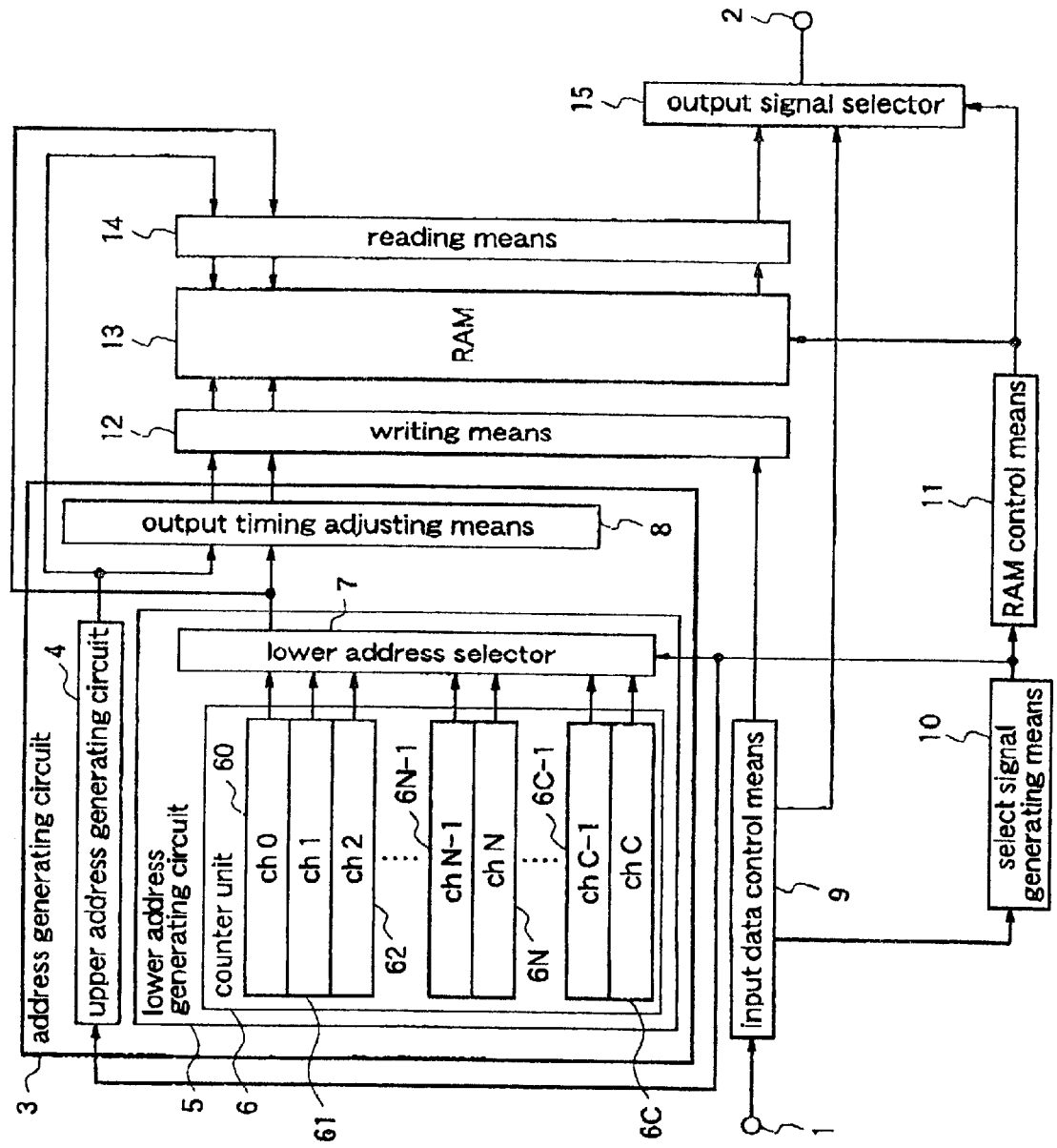
FIG. 15 is a block diagram illustrating a convolutional interleaver according to another prior art.

The convolutional deinterleaver of this fourth embodiment is realized by replacing the storage areas 112-0, . . . , 112-(C−1) shown in FIG. 18 with storage areas inside the single port RAM (bit width b) 152-0, . . . , 152-((C−1)/2) and storage areas inside the single port RAM (bit width 2b) 153-0, 153-(N/2), . . . shown in FIG. 11, and employing selectors 150 and 151 which circularly switch the channels. Those selectors 150 and 151 start from ch0, successively increment the channel number, and return to ch0 when reaching chC to repeat the same operation as above.

In this fourth embodiment, the storage areas 152-0, . . . , 152-((C−1)/2) may be included in another RAM, separated from the storage areas 153-0, . . . , 153-(N/2), . . . When these storage areas 152-0, . . . , 152-((C−1)/2) and 153-0, . . . , 153-(N/2), . . . are included in the same RAM, the storage areas 152-0, . . . , 152-((C−1)/2) may be combined by twos to make the bit width equal to that of the storage areas 153-0, . . . , 153-(N/2) . . .

Initially, both of the selectors 150 and 151 select ch0. At this channel, a delay as much as that at chC-1 by the storage area 152-(C−1)/2) of the RAM 243 (described later) is made by the storage area 152-0 of the RAM 243 and, further, a delay C−1(>N) times as much as that at chC-2 (described later) is made by the storage area 153-0 of the RAM 243. Consequently, a signal delayed by C times as much as the delay at chC-1 is output.

Next, the selectors 150 and 151 select ch1. At this channel, since no storage area 152-0 of the RAM 243 exists, a signal delayed by C−1 times as much as the delay at chC-1 is output.

Then, the selectors 150 and 151 select chN. The data of chN is retained by a rogister (not shown) until the next channel cnH+1 is selected. The data of chN is delayed by C−N(>1) times as much as the delay at chC-1 by the storage areas 152-N/2 and 153-N/2 in the RAM 243, to be output.

At chN+1, since no storage area 152-N/2 of the RAM 243 exists, a signal delayed by C−(N+1) (>1) times as much as the delay at chC-1 by the storage area 153-N/2 of the RAM 243, is output.

Further, at chC-1, a delay is made by only the storage area 152-((C−1)/2) of the RAM 243.

Thereafter, the selectors 150 and 151 select chC. Since no original delay element exists at this channel, the signal of chC travels through the convolutional deinterleaver without being subjected to the original delay.

At the next point of time, the selectors 150 and 151 select ch0 again to repeat the above-mentioned operation.

Thereby, the respective channels ch0~chN~chC are given gradually decreasing delay times by the convolutional deinterleaver shown in FIG. 10 whereas these channels have been given gradually increasing delay times by the convolutional interleaver shown in FIG. 7. Synthetically, the same time is given to all the channels, whereby the data array which has been interleaved by the convolutional interleaver shown in FIG. 7 is deinterleaved (restored) by the convolutional deinterleaver shown in FIG. 10.

More specifically, when the selectors 150 and 151 select the channel chN at time t, the oldest data is read from the storage area 152-N/2 of the RAM 243, and the input data of the convolutional deinterleaver is written in the address from which the data has been read. Further, the read data is stored in the register 238 of FIG. 10. At time t+1 (the selectors 150 and 151 select the channel chN+1), the input data of the convolutional deinterleaver and the output of the register 238 are simultaneously written in the storage area 153-N/2 of the RAM 243, as the lower b bit and the upper b bit, respectively. At time t+N×m×(C+1), these data are read simultaneously, and the upper b bit is output from the convolutional deinterleaver while the lower b bit is stored in the register 247. At time t+1+N×m×(C+1), the output of the register 247 is output from the convolutional deinterleaver. By repeating the above-described processing, convolutional deinterleaving is realized.

Next, the operation of the convolutional deinterleaver of this fourth embodiment will be described.

The convolutional interleaver captures input data to be deinterleaved from the input data terminal 251 by the input data control means 236, and writes the data into the RAM 243 by the writing means 242. At this time, one address counter is assigned to two channels (ch) of b-bit data. Then, the counters 2330~233C-3 of the lower address generating means 232 corresponding to ch0 and ch1 (hereinafter, ch0/ch1)~chN−1 and chN (chN−1/chN)~chC-3 and chC-2 (chC-3/chC-2), respectively, count the lower addresses of the RAM 243. The lower address selector 232 selects one of these counters. The lower address so selected and the upper address of the RAM 243 output from the upper address generating means 231 are input to the output timing adjusting means 235, wherein their output timings are adjusted. Thereafter, these addresses are input to the writing means 242 to give a write address to the RAM 213.

At this time, the data of ch0 is input to the register 238 by the output signal selector 245, and connected with the data of ch1 by the bit connecting means 237 to be input to the RAM 243.

In the RAM 243, storage areas corresponding to ch0 and ch1 are set by the address generating means 253 and 230, and the data of the ch0 and ch1 are respectively delayed by a delay time CT in these areas.

Then, the data of ch0 and ch1 are simultaneously read from the RAM 243 to be input to the bit separating means 246 under control of the output signal selector 245.

The bit separating means 246 immediately outputs the data of ch0 through the output data control means 248 to the output terminal 252. On the other hand, the data of ch1 is temporarily stored in the register 247, and then it is output through the output data control means 248 to the output terminal 252.

Further, with respect to data of ch2~chN~chC-2, under control of the select signal generating means 240, storage areas for these data are set in the RAM 243 by the upper address generating means 231 and the counter unit 233 of the lower address generating means 232 such that the sizes of these storage areas decrease in order of the channels, with two channels as a unit, and these storage areas are successively selected by an upper address selector (not shown) and the lower address selector 234 for every two channels as a unit. With respect to the channels to which two channels of b-bit data are sequentially applied, the following operation is performed on each storage area for every two channels. That is, the data is written in an address in the storage area and, at the next point of time, the data is read from the address to be written in the next address.

Further, with respect to the even channels ch2~chN-1~chC-1, under control of the select signal generating means 240, the address generating means 253 performs address generation by using the storage areas of the RAM 243 such that a delay time, which is equivalent to a difference between delay times to be possessed by an odd channel and an even channel adjacent to the odd channel, is generated.

Thereby, a delay time CT/(C−1)T is given to ch0/ch1, a delay time (C−2)T/(C−3)T is given to ch2/ch3, . . . , and a delay time 3T/2T is given to chC-3/chC-2.

This operation is to make the same delay as that given by the shift register unit shown in FIG. 4, by using the address 243.

Thereby, a delay time T is given to ch0, ch2, . . . , chC-3, chC-1, respectively.

More specifically, the address generating means 253 generates delay times equivalent to those given by the shift register unit 78 shown in FIG. 4 in which the shift registers corresponding to the respective channels are successively selected for every two channels and these shift registers have the capacities equivalent to the increments in delay time from the odd channels ch1, ch3~chN~chC, whereby gradually decreasing delay times are given to the data at the channels ch0~chN~chC.

Accordingly, by successively selecting the channels from ch0 to chC-2 under control of the select signal generating means 240, delay times which decrease T by T with the increments in the channel number can be given to the respective channels.

Thereafter, data of chC-1 is input, and finally data of chC is input. With respect to the data of chC-1, the data of chC transmitted from the output signal selector 245 to the register 238 is combined with the data of chC-1 output from the input data control means 236 by the bit connecting means 237. The RAM control means 241 under control of the select signal generating means 240 controls the RAM 243 so that the connected data is written in the RAM 243 via the writing means 242. At this time, the select signal generating means 240 and the RAM control means 241 perform the following operation on each storage area for every two channels. That is, the upper address and the lower address generated by the address generating means 253 are used as addresses of the RAM 243 and, with respect to the addresses generated by the address generating means 253, data is written in an address in each storage area and, at the next point of time, the data is read from the address to be written in another address. Thereby, no delay is made for chC while a delay of a predetermined period is made for chC-1 by the RAM 243 operating as an FIFO.

Further, with respect to the data of chC, the select signal generating means 240 controls the input data control means 236 so that the data of chC is transmitted not through the RAM 243 but directly to the output signal selector 245. Further, the RAM control means 241 under control of the selector signal generating means 240 controls the output signal selector 245 so that it selects the non-delayed data which has been sent from the input data control means 206 directly to the output signal selector 245.

The data of chC and chC-1 read from the RAM 243 are input to the bit separating means 246 via the output signal selector 245. The data of chC is output as it is through the output terminal 252, and the data of chC-1 is output through the register 247 and the output terminal 252. Thereby, delays equivalent to the delays made by the shift register unit shown in FIG. 4 are realized.

While in the prior art convolutional deinterleaver one address-generating circuit is needed for each channel, in the structure of this embodiment one address-generating circuit is needed for two channels. Therefore, the address generating circuits are reduced to ½, resulting in considerable reduction in circuit scale. Further, since the address generating circuits can be implemented without using shift registers, the density of integration is increased, resulting in further reduction in circuit scale as compared with the second embodiment.

Moreover, while in the prior art one read/write process is needed for one channel of input data in the single port RAM, in this fourth embodiment one read/write process is needed for two channels of input data, resulting in a reduction in power consumption. Further, since the frequency at which the RAM is accessed is reduced, even a RAM operating at a relatively low operating frequency can be employed.

While in this fourth embodiment two channels are united as one group and one address-generating circuit is assigned to one group, one address-generating circuit may be assigned to three or more channels.

Generally, the input/output data width is b bits, the depth (the number of data in bit width units) is m, the number of channels in n, and the maximum channel number is C (n is an integer satisfying the relation $0 \leq n \leq C$, and b, m, C are natural numbers).

Especially when the convolutional deinterleaver of this embodiment is applied to DVB specification, C=11, i.e., the number of channels is 12, and the depth is 17. Further, when applied to American ground wave specification, C=51, i.e., the number of channels is 52, and the depth of 4.

Further, while in this fourth embodiment a delay equivalent to a difference in delays between two adjacent channels is given not by shift registers but by a storage area of the RAM, a delay larger than the difference between channels may be given by this storage area of the RAM.

Moreover, while in this fourth embodiment a single port RAM is employed, a multiple port RAM may be employed for high speed I/O.

[Embodiment 5]

In a convolutional interleaver according to a fifth embodiment of the invention, when address counters for a RAM are combined for every two channels as a unit, these address counters are implemented by an adder and a register unit, whereby the circuit scale of the RAM's peripheral unit is further reduced.

Figure 19:
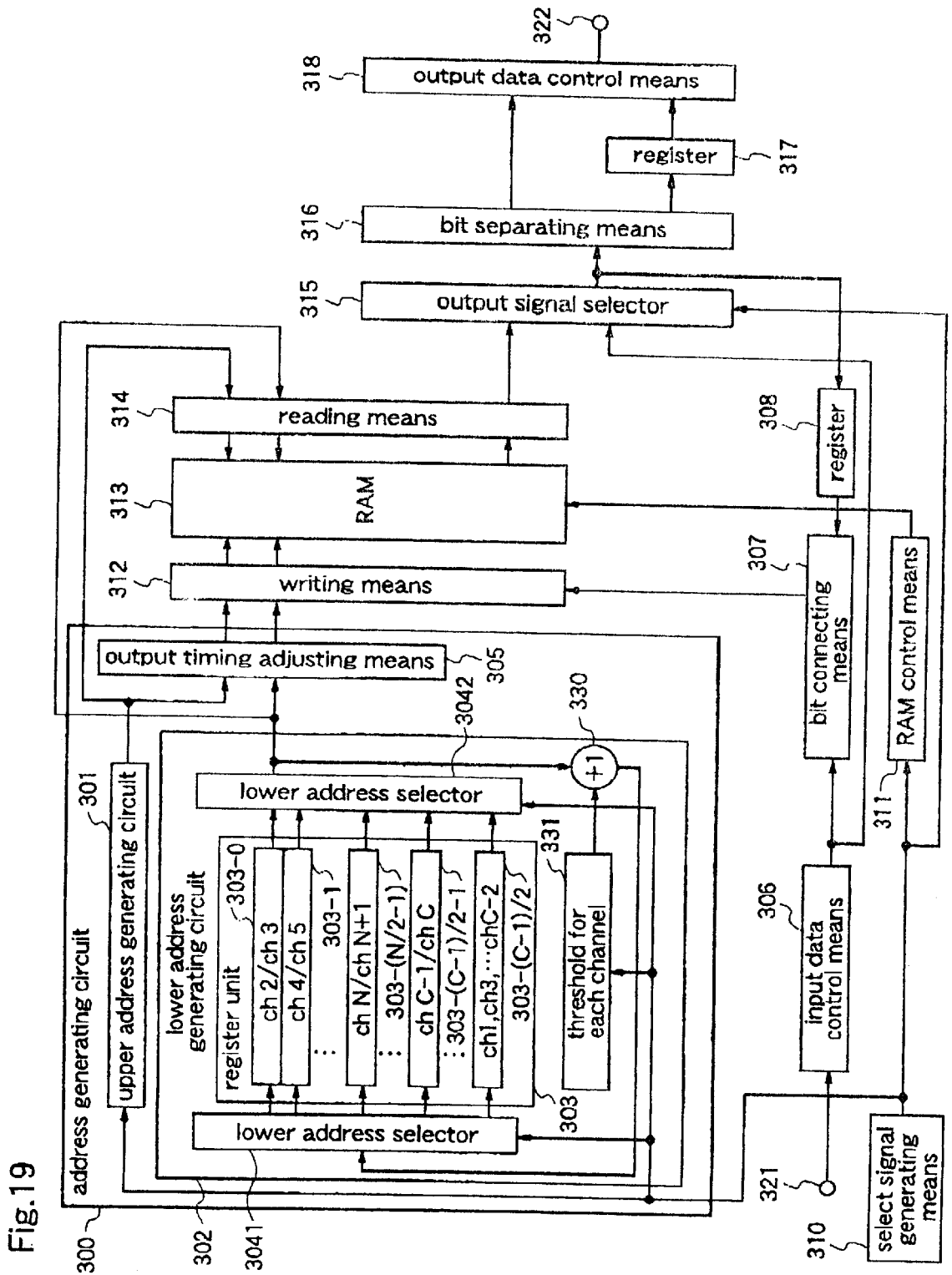
FIG. 19 is a block diagram illustrating a convolutional interleaver according to a fifth embodiment of the invention.

FIG. 19 is a block diagram illustrating the structure of a convolutional interleaver according to the fifth embodiment.

With reference to FIG. 19, the convolution interleaver comprises a single port RAM 313 (i.e., storage means), an input data control means 306, a register 308, a bit connecting means 307, a select signal generating means 310, a RAM control means 311, an address generating means 300, a writing means 312, a reading means 314, an output signal selector 315, a bit separating means 316, a register 317, and an output data control means 318.

The single port RAM 313 outputs data to the reading means 314. The input data control means 306 outputs input data 321 of the convolutional interleaver to the bit connecting means 307 and the output signal selector 315. The register 308 outputs data to the bit connecting means 307. The bit connecting means 307 output data to the writing means 312. The select signal generating means 310 outputs a control signal to the address generating means 300k, the RAM control means 311, and the output signal selector 315. The RAM control means 311 outputs a control signal to the RAM 313. The address generating means 300 outputs a RAM address to the writing means 312 and the reading means 314. The writing means 312 outputs a RAM address and data to the RAM 313. The reading means 314 outputs a RAM address to the RAM 313 and outputs data to the output signal selector 315. The output signal selector 315 outputs data to the register 308 and the bit separating means 316. the bit separating means 316 outputs data to the output data control means 318 and the register 317. The register 317 outputs data to the output data control means 318. The output data control means 318 outputs data 322 as the outputs of the interleaver.

The address generating means 300 comprises an upper address generating means 301, a lower address generating means 302, and an output timing adjusting means 305. The upper address generating means 301 generates an upper address of the RAM 313 according to a select signal generated by the select signal generating means 310 and outputs the upper address to the output timing adjusting means 305. The lower address generating means 302 generates a lower address of the RAM 313 according to a select signal generated by the select signal generating means 310 and outputs the lower address to the output timing adjusting means 305. The output timing adjusting means 305 outputs a RAM address to the writing means 312 and the reading means 314.

The lower address generating means 302 comprises a register 331, an adder 330, lower address selectors 3041 and 3042, and a register unit 303. The register 331 retains a threshold for every two channels. The adder 330 adds the output of the lower address selector 3042 to the output of the register 331. The lower address selector 3041 outputs the output of the adder 330 to the register unit 303. The register unit 303 comprises registers 303-0~303-(C-1)/2-1 corresponding to channels ch2/ch3~chC-1/chC, and a register 303-(C-1)//2 corresponding to channels ch1, ch3, . . . , chC—2. The output timing adjusting means 305 outputs a lower address from the lower address selector 3042 to the writing means 312.

The select signal generating means 310 and the address generating means 300 serve as an input side selector in the operation principle described later. Further, the output signal selector 315 and the address generating means 300 serve as an output side selector in the operation principle.

The convolutional interleaver of this fifth embodiment implements means corresponding to the counters included in the lower address generating means 202 and 225 of the third embodiment (see FIG. 7), by using the adder 330 and the register unit 303 both included in the lower address generating means 302, whereby the counters of the third embodiment are united, resulting in further reduction in circuit scale of the convolutional interleaver.

Hereinafter, the operation of the lower address generating means 302 will be described with respect to the process for each channel selected by the lower address selectors 3041 and 3042. The operation identical to that already described for the third embodiment will be omitted.

First of all, when the lower address deflectors 3041 and 3042 select channel ch0, no lower address is generated because no delay element of data exists at this channel of the interleaver.

Next, when the lower address selector 3041 selects odd channels, such as ch1, ch3, ch5, . . . , the register 303-(C-1)/2 is selected, and the lower address selector 3042 outputs data to the output timing adjusting means 305 and the adder 330.

The adder 330 adds "1" to the input data. When the result of the addition exceeds the threshold stored in the register 331, the adder 330 outputs "0" to the lower address selector 3041, and when it does not exceed the threshold, the adder 330 outputs the result of the addition to the selector 3041.

The lower address selector 3041 outputs this value to the register 303- (C-1)/2. At this time, if the lower address selector 3041 selects the maximum channel amongst the odd channels, the register 303- (C-1)/2 is updated to the input data value.

When the lower address selector 3041 selects ch2, the register 303-0 is selected, and the lower address selector 3042 outputs data to the output timing adjusting means 305 and the adder 330.

As the threshold for each channel, the register 331 outputs a threshold corresponding to the register 303-0 to the adder 330. The adder 330 adds "1" to the input data. When the result of the addition exceeds the threshold, the adder 330 outputs "0" to the lower address selector 3041, and when it does not exceed the threshold, the adder 330 outputs the result of the addition to the selector 3041.

The lower address selector 3041 outputs either "0" or the result of the addition to the register 303-0 to update the register 303-0 to the input data value.

When the lower address selector 3041 selects ch4, the register 303—1 is selected, and the lower address selector 3042 outputs data to the output timing adjusting means 305 and the adder 330.

As the threshold for each channel, the register 331 outputs a threshold corresponding to the register 303-1 to the adder 330. The adder 330 adds "1" to the input data. When the result of the addition exceeds the threshold, the adder 330 outputs "0" to the lower address selector 3041, and when it does not exceed the threshold, the adder 330 outputs the result of the addition to the selector 3041.

The lower address selector 3041 outputs either "0" or the result of the addition to the register 303-1 to update the register 303-1 to the input data value.

Likewise, when the lower address selector 3041 selects chN, the register 303-(N/2-1) is selected, and the lower address selector 3042 outputs data to the output timing adjusting means 305 and the adder 330.

As for the threshold for each channel, the register 331 outputs the threshold of the register 303- (N/2-1) to the adder 330.

The adder 330 adds "1" to the input data. When the result of the addition exceeds the threshold, the adder 330 outputs "0" to the lower address selector 3041, and when it does not exceed the threshold, the adder 330 outputs the result of the addition to the selector 3041.

The lower address selector 3041 outputs either "0" or the result of the addition to the register 303- (N/2-1) to update the register 303- (N/2-1) to the input data value.

By repeating the above-described operation, the lower address counts of the RAM can be realized by the adder and the register unit, whereby the circuit scale can be reduced as compared with the third embodiment employing address counters.

[Embodiment 6]

In a convolutional deinterleaver according to a sixth embodiment of the invention, when address counters for a RAM are combined for every two channels as a unit, these address counters are implemented by an adder and a register unit k, whereby the circuit scale of the RAM's peripheral unit is further reduced.

Figure 20:
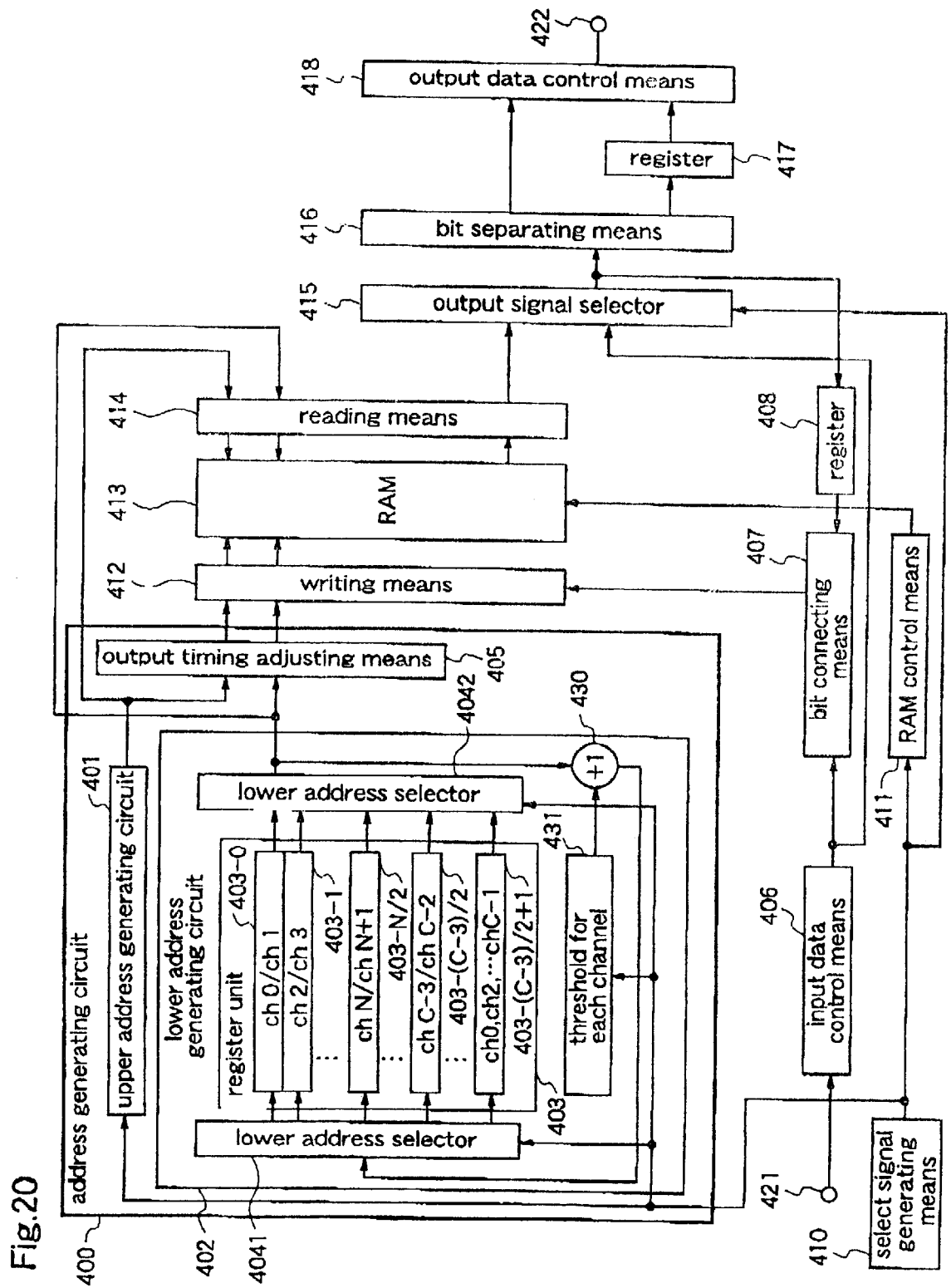
FIG. 20 is a block diagram illustrating a convolutional deinterleaver according to a sixth embodiment of the invention.

FIG. 20 is a block diagram illustrating the structure of a convolutional deinterleaver according to the sixth embodiment.

With reference to FIG. 20, the convolutional interleaver comprises a single port RAM 413 (i.e., storage means), an input data control means 406, a register 408, a bit connecting means 407, a select signal generating means 410, a RAM control means 411, an address generating means 400, a writing means 412, a reading means 414, an output signal selector 415, a bit separating means 416, a register 417, and an output data control means 418.

The single port RAM 413 outputs data to the reading means 414. The input data control means 406 outputs input data 421 of the convolutional deinterleaver to the bit connecting means 407 and the output signal selector 415. The register 408 outputs data to the bit connecting means 407. The bit connecting means 407 outputs data to the writing means 412. The select signal generating means 410 outputs a control signal to the address generating means 400, the RAM control means 411, and the output signal selector 415. The RAM control means 411 outputs a control signal to the RAM 413. The address generating means 400 outputs a RAM address to the writing means 412 and the reading means 414. The writing means 412 outputs a RAM address and data to the RAM 413. The reading means 414 outputs a RAM address to the RAM 413 and outputs data to the output signal selector 415. The output signal selector 415 output data to the register 408 and the bit separating means 416. The bit separating means 416 outputs data to the output data control means 418 and the register 417. The register 417 outputs data to the output data control means 418. The output data control means 418 outputs data 422 as the output of the deinterleaver.

The address generating means 400 comprises an upper address generating means 401, a lower address generating means 402, and an output timing adjusting means 405. The upper address generating means 401 generates an upper address of the RAM 413 according to a select signal generated by the select signal generating means 410 and outputs the upper address to the output timing adjusting means 405. The lower address generating means 402 generates a lower address of the RAM 413 according to a select signal generated by the select signal generating means 410 and outputs the lower address to the output timing adjusting means 405. The output timing adjusting means 405 outputs a RAM address to the writing means 412 and the reading means 414.

The lower address generating means 402 comprises a register 431, an adder 430, lower address selectors 4041 and 4042, and a register unit 403. The register 431 retains a threshold for every two channels. The adder 430 adds the output of the lower address selector 4042 to the output of the register 431. The lower address selector 4041 outputs the output of the adder 430 to the register unit 403. The register unit 403 comprises registers 403-0~403-(C-1)/2-1 corresponding to channels ch0/ch1~chC-3/chC-2, and a register 403-(C-3)/2+1 corresponding to channels ch0, ch2, . . . , chC-1. The output timing adjusting means 405 outputs a lower address from the lower address selector 4042 to the writing means 412.

The select signal generating means 410 and the address generating means 400 serve as an input side selector in the operation principle described later. Further, the output signal selector 415 and the address generating means 400 serve as an output side selector in the operation principle.

The convolutional deinterleaver of this sixth embodiment implements means corresponding to the counters included in the lower address generating means 232 and 255 of the fourth embodiment (see FIG. 10), by using the adder 430 and the register unit 403 both included in the lower address generating means 402, whereby the counters of the third embodiment are united, resulting in further reduction in circuit scale of the convolutional deinterleaver.

Hereinafter, the operation of the lower address generating means 402 will be described with respect to the process for each channel selected by the lower address selectors 4041 and 4042. The operation identical to that already described for the fourth embodiment will be omitted.

First of all, when the lower address selectors 4041 and 4042 select channel chC, no lower address is generated because no delay element of data exists at this channel of the deinterleaver.

Next, when the lower address selector 4041 selects even channels, such as ch0, ch2, ch4, . . . , the register 403-(C-3)/2+1 is selected, and the lower address selector 4042 outputs data to the output timing adjusting means 405 and the adder 430.

The adder 430 adds "1" to the input data. When the result of the addition exceeds the threshold stored in the register 431, the adder 430 outputs "0" to the lower address selector 4041, and when it does not exceed the threshold, the adder 430 outputs the result of the addition to the selector 4041.

The lower address selector 4041 outputs this value to the register 403-(C-3)/2+1. At this time, if the lower address selector 4041 selects the maximum channel amongst the even channels, the register 403-(C-3)/2+1 is updated to the input data value.

When the lower address selector 4041 selects ch2, the register 403-0 is selected, and the lower address selector 4042 outputs data to the output timing adjusting means 405 and the adder 430.

As the threshold for each channel, the register 431 outputs a threshold corresponding to the register 403-0 to the adder 430. The adder 430 adds "1" to the input data. When the result of the addition exceeds the threshold, the adder 430 outputs "0" to the lower address selector 4041, and when it does not exceed the threshold, the adder 430 outputs the result of the addition to the selector 4041.

The lower address selector 4041 outputs either "0" or the result of the addition to the register 403-0 to update the register 403-0 to the input data value.

When the lower address selector 4041 selects ch4, the register 403-1 is selected, and the lower address selector 4042 outputs data to the output timing adjusting means 405 and the adder 430.

As the threshold for each channel, the register 431 outputs a threshold corresponding to the register 403-1 to the adder 430. The adder 430 adds "1" to the input data. When the result of the addition exceeds the threshold, the adder 430 outputs "0" to the lower address selector 4041, and when it does not exceed the threshold, the adder 430 outputs the result of the addition to the selector 4041.

The lower address selector 4041 outputs either "0" or the result of the addition to the register 403-1 to update the register 403-1 to the input data value.

Likewise, when the lower address selector 4041 selects chN, the register 403-N/2 is selected, and the lower address selector 4042 outputs data to the output timing adjusting means 405 and the adder 430.

As the threshold for each channel, the register 431 outputs the threshold of the register 403-N/2 to the adder 430.

The adder 430 adds "1" to the input data. When the result of the addition exceeds the threshold, the adder 430 outputs "0" to the lower address selector 4041, and when it does not exceed the threshold, the added 430 outputs the result of the addition to the selector 4041.

The lower address selector 4041 outputs either "0" or the result of the addition to the register 403-N/2 to update the register 403-N/2 to the input data value.

By repeating the above-described operation, the lower address counts of the RAM can be realized by the adder and the register unit, whereby the circuit scale can be reduced as compared with the fourth embodiment employing address counters.

What is claimed is:

1. A convolutional interleaver for performing convolutional interleaving for a data group in which the input/output data width is b bits, the depth, that is, the number of data in bit width units, is m, the number of channels is n, and the maximum channel number is C(n=integer satisfying the relation $0 \leq n \leq C$, b, m, C=natural numbers), said convolutional interleaver comprising:

a delay means comprising first and second delay units and performing a delay of nT for data of the n-th channel (T=a predetermined amount of delay, T>0), said first delay unit performing a delay of iS (S=a predetermined amount of delay, $0 < S \leq T$) for the i-th group amongst groups into which all the channels are grouped such that each group comprises at most k channels, said i-th group comprising channels from the ik-th channel to the ((i+l)k-1)-th channel (k=natural number not larger than C, i=integer satisfying the relation $0 \leq i \leq$(integer part of (C/k)), (i+l)k-1$\leq$C), and said second delay unit performing a delay equivalent to a deficiency in the delay of the first delay unit for the delay of nT to be given to the data of the n-th channel.

2. The convolutional interleaver of claim 1, wherein C is an odd number, k is 2, S and T satisfy the relation S=T, and said second delay unit performs a delay of T for the (2h+1)-th channel (h=integer satisfying the relation $0 \leq 2h+1 \leq C$) and does not perform a delay for the 2 h-th channel.

3. A convolutional interleaver for performing convolutional interleaving for a data group in which the input/output data width is b bits, the depth, that is, the number of data in bit width units, is m, the number of channels is n, and the maximum channel number is C(n=integer satisfying the relation $0 \leq n \leq C$, b, m, C=natural numbers), said convolutional interleaver comprising:

a first storage means having a data width of j X b bits (j=natural number not less than 2);

an input data control means for distributing input data of said convolutional interleaver to a bit connecting means, a second storage means, or an output data control means;

said second storage means for delaying input data from said input data control means;

said bit connecting means for connecting input data from said input data control means and input data from said second storage means to generate data to be input to said first storage means having a data width of j X b bits;

an address generating means for generating addresses of said first storage means;

a bit separating means for converting output data from said first storage means into data having a data width of b bits and to be output from said convolutional interleaver; and said output data control means for outputting output data from said bit separating means to the outside of said convolutional interleaver.

4. The convolutional interleaver of claim 3, wherein:

said address generating means performing address generation such that said first storage means performs a delay of iS (S=a predetermined amount of delay, 0<S) for the i-th group amongst groups into which all the channels are grouped such that each group comprises at most k channels, said i-th group comprising channels from the ik-th channel to the ((i+1)k-1)-th channel (k=natural number not larger than C, i=integer satisfying the relation $0 \leq i \leq$ (integer part of (C/k)), (i+1)k-$1 \leq C$); and said second storage means having a capacity sufficient to perform a delay equivalent to a deficiency in the delay of said first storage means for the delay of nT)T=a predetermined amount of delay, $S \leq T$) to be given to the data of the n-th channel;

wherein said convolutional interleaver further comprises:
a switching means for successively switching the channels every time data of b bits and depth m is input, such that the channel of data input to said first storage means and said second storage means is identical in channel number to the channel of the data output from said first storage means.

5. The convolutional interleaver of claim 4, wherein C is an odd number, k is 2, S and T satisfy the relation S=T, and said second delay unit performs a delay of T for the (2h+1)-th channel (h=integer satisfying the relation $0 \leq 2h+1 \leq C$) and does not perform a delay for the 2h-th channel.

6. The convolutional interleaver of claim 3, wherein said second storage means and said first storage means are constructed by the same kind of storage means.

7. The convolutional interleaver of claim 3, wherein said first storage means is constructed by a RAM.

8. The convolutional interleaver of claim 7, wherein said RAM has j pieces of input/output ports (j=natural number not less than 2).

9. A convolutional deinterleaver for performing convolutional interleaving for a data group in which the input/output data width is b bits, the depth, that is, the number of data in bit width units, is m, the number of channels is n, and the maximum channel number is C(n=integer satisfying the relation $0 \leq n \leq C$, b, m, C=natural numbers), said convolutional deinterleaver comprising:

a delay means comprising first and second delay units and performing a delay of (C-n)T for data of the n-th channel (T=a predetermined amount of delay, $0 < S \leq T$) for the i-th group amongst groups into which all the channels are grouped such that each group comprises at most k channels, said i-th group comprising channels from the ik-th channel to the ((i+1)k-1)-th channel (k=natural number not larger than C,i=integer satisfying the relation $0 \leq i \leq$(integer part of (C/k)), (i+1)k-$1 \leq C$), and said second delay unit performing a delay equivalent to a deficiency in the delay of the first delay unit for the delay of (C-n)T to be given to the data of the n-th channel.

10. The convolutional deinterleaver of claim 9, wherein C is an odd number, k is 2, S and T satisfy the relation S=T, and said second delay unit performs a delay of T for the (2h−1)-th channel (h=integer satisfying the relation $0 \leq 2h+1 \leq C$) and does not perform a delay for the 2h-th channel.

11. A convolutional deinterleaver for performing convolutional deinterleaving for a data group in which the input/output data width is b bits, the depth, that is, the number of data in bit width units, is m, the number of channels is n, and the maximum channel number is C (n=integer satisfying the relation $0 \leq n \leq C$, b, m, C=natural numbers), said convolutional deinterleaver comprising:

a first storage means having a data width of j X b bits (j=natural number not less than 2);

an input data control means for distributing input data of said convolutional deinterleaver to a bit connecting means, a second storage means, or an output data control means;

said second storage means for delaying input data from said input data control means;

said bit connecting means for connecting input data from said input data control means and input data from said second storage means to generate data to be input to said first storage means having a data width of j X b bits;

an address generating means for generating addresses of said first storage means;

a bit separating means for converting output data from said first storage means into data having a data width of b bits and to be output from said convolutional deinterleaver; and said output data control means for outputting output data from said bit separating means to the outside of said convolutional deinterleaver.

12. The convolutional deinterleaver of claim 11, wherein:

said address generating means performing address generation such that said first storage means performs a delay of (C−i)S (S=a predetermined amount of delay, 0<S) for the i-th group amongst groups into which all the channels are grouped such that each group comprises at most k channels, said i-th group comprising channels from the ik-th channel to the ((i+1)k-1)-th channel (k=natural number not larger than C, i=integer satisfying the relation $0 \leq i \leq$(integer part of (C/k)), (i+1) k-$1 \leq C$); and said second storage means having a capacity sufficient to perform a delay equivalent to a deficiency in the delay of said first storage means for the delay of (C-n)T (T=a predetermined amount of delay, $S \leq T$) to be given to the data of the n-th channel;

wherein said convolutional deinterleaver further comprises:
a switching means for successively switching the channels every time data of b bits and depth m is input, such that the channel of data input to said first storage means and said second storage means is identical in channel number to the channel of the data output from said first storage means.

13. The convolutional deinterleaver of claim 12, wherein C is an odd number, k is 2, S and T satisfy the relation S=T, and said second delay unit performs a delay of T for the (2h+1)-th channel (h=integer satisfying the relation $0 \leq 2h+1 \leq C$) and does not perform a delay for the 2 h-th channel.

14. The convolutional deinterleaver of claim 11, wherein said second storage means and said first storage means are constructed by the same kind of storage means.

15. The convolutional deinterleaver of claim 11, wherein said first storage means is constructed by a RAM.

16. The convolutional interleaver of claim 15, wherein said RAM has j pieces of input/output ports (j=natural number not less than 2).

17. A convolutional interleaving method for performing convolutional interleaving on a data group in which the input/output data width is b bits, the depth, that is, the number of data in bit width units, is m, the number of channels is n, and the maximum channel number is C (n=integer satisfying the relation $0 \leq n \leq C$, b, m, C=natural numbers), said convolutional interleaving method comprising:

employing a delay means which performs a delay of nT(T=a predetermined amount of delay, T>)) for data of the n-th channel, and comprises first and second delay units;

performing, by using the first delay unit, a delay of iS(S=a predetermined amount of delay, $0<S \leq T$) on the i-th group amongst groups into which all the channels are grouped such that each group comprises at most k channels, said i-th group comprising channels from the ik-th channel to the ((i+1)k-1)-the channel (k=natural number not larger than C, i=integer satisfying the relation $0 \leq i \leq$ (integer part of (C/k)), (i+1) k-1$\leq$C), and performing, by using the second delay unit, a delay equivalent to a deficiency in the delay of the first delay unit for the delay of nT to be given to the data of the n-th channel.

18. The convolutional interleaving method of claim 17, wherein C is an odd number, k is 2, S and T satisfy the relation S=T, and the second delay unit performs a delay of T for the (2h+1)-th channel (h=integer satisfying the relation $0 \leq 2h+1 \leq C$) and does not perform a delay for the 2 h-th channel.

19. A convolutional interleaving method for performing convolutional interleaving on a data group in which the input/output data width is b bits, the depth, that is, the number of data in bit width units, is m, the number of channels is n, and the maximum channel number is C (n=integer satisfying the relation $0 \leq n \leq C$, b, m, C=natural numbers), said convolutional interleaving method comprising:

employing a first storage means which is able to store data having a data width of j X b bits (j=natural number not less than 2);

distributing input data to a bit connecting means, a second storage means, or an output data control means by using an input data control means;

delaying output data from the input data control means by suing the second storage means;

combining output data from the input data control means and output data from the second storage means by using the bit connecting means to generate data to be input to the first storage means having a data width of j X b bits;

generating addresses of the first storage means into convolutionally interleaved data having a data width of b bits, by using a bit separating means; and outputting output data from the bit separating means by using the output data control means.

20. The convolutional interleaving method of claim 19, wherein:

the address generating means performs address generation such that the first storage means performs a delay of iS(S=a predetermined amount of delay, 0<S) on the i-th group amongst groups into which all the channels are grouped such that each group comprises at most k channels, said i-th group comprising channels from the ik-th channel to the ((i+1)k-1)-th channel (k=natural number not larger than C, i=integer satisfying the relation $0 \leq i \leq$ (integer part of (C/k)), (i+1)k-1$\leq$C);

the second storage means has a capacity sufficient to perform a delay equivalent to a deficiency in the delay of the first storage means for the delay of nT(T=a predetermined amount of delay, $S \leq T$) to be given to the data of the n-th channel; and channel switching is performed every time data of b bits and depth m is input, such that the channel of data input to the first storage means and the second storage means is identical in channel number to the channel of the data output from the first storage means.

21. The convolutional interleaving method of claim 20, wherein C is an odd number, k is 2, S and T satisfy the relation S=T, and the second delay unit performs a delay of T for the (2h+1)-th channel (h=integer satisfying the relation $0 \leq 2$ h+1$\leq$C) and does not perform a delay for the 2 h-th channel.

22. A convolutional deinterleaving method for performing convolutional deinterleaving on a data group in which the input/output data width is b bits, the depth, that is, the number of data in bit width units, is m, the number of channels is n, and the maximum channel number is C (n=integer satisfying the relation $0 \leq n \leq nC$, b, m, C=natural numbers), said convolutional deinterleaving method comprising:

employing a delay means which performs a delay of (C-n)T(T=a predetermined amount of delay, T>0) for data of the n-th channel, and comprises first and second delay units;

performing, by using the first delay unit, a delay of (C-i)iS (S=a predetermined amount of delay, $0<S \leq T$) on the i-th group amongst groups into which all the channels are grouped such that each group comprises at most k channels, said i-th group comprising channels from the ik-th channel to the ((i+1)k-1)-th channel (k=natural number not larger than C,i=integer satisfying the relation $0 \leq i \leq$(integer part of (C/k)), (i+1) k-1$\leq$C), and performing, by using the second delay unit, a delay equivalent to a deficiency in the delay of the first delay unit for the delay of (C-n)T to be given to the data of the n-th channel.

23. The convolutional deinterleaving method of claim 22, wherein C is an odd number, k is 2, S and T satisfy the relation S=T, and the second delay unit performs a delay of T for the (2+1)-th channel (h=integer satisfying the relation $0 \leq 2$ h+1$\leq$C) and does not perform a delay for the 2 h-th channel.

24. A convolutional deinterleaving method for performing convolutional deinterleaving on a data group in which the input/output data width is b bits, the depth, that is, the number of data in bit width units, is m, the number of channels is n, and the maximum channel number is C(n= integer satisfying the relation $0 \leq n \leq C$, b, m, C=natural numbers), said convolutional deinterleaving method comprising:

employing a first storage means which is able to store data having a data width of j X b bits (j=natural number not less than 2);

distributing input data to a bit connecting means, a second storage means, or an output data control means by using an input data control means;

delaying output data from the input data control means by using the second storage means;

combining output data from the input data control means and output data from the second storage means by using the bit connecting means to generate data to be input to the first storage means having a data width of j X b bits;

generating addresses of the first storage means by an address generating means;

converting output data from the first storage means into convolutionally deinterleaved data having a data width of b bits, by using a bit separating means; and outputting output data from the bit separating means by using the output data control means.

25. The convolutional deinterleaving method of claim 24, wherein:

the address generating means performs address generation such that said first storage means performs a delay of (C-i)S (S=a predetermined amount of delay, 0<S) on the i-th group amongst groups into which all the channels are grouped such that each group comprises at most k channels, said i-th group comprising channels from the ik-th channel to the ((i+1)k-1)-th channel (k=natural number not larger than C, i=integer satisfying the relation 0≦i≦(integer part of (C/k)), (i+1)k-1≦C);

the second storage means has a capacity sufficient to perform a delay equivalent to a deficiency in the delay of the first storage means for the delay of (C-n)T(T=a predetermined amount of delay, S≦T) to be given to the data of the n-th channel; and channel switching is performed every time data of b bits and depth m is input, such that the channel of data input to the first storage means and the second storage means is identical in channel number to the channel of the data output from the first storage means.

26. The convolutional deinterleaving method of claim 25, wherein C is an odd number, k is 2, S and T satisfy the relation S=T, and the second delay unit performs a delay of T for the (2 h+1)-th channel (h=integer satisfying the relation 0≦2 h +1≦C) and does not perform a delay for the 2 h-th channel.

* * * * *